(12) United States Patent
Yamazaki et al.

(10) Patent No.: US 9,941,343 B2
(45) Date of Patent: Apr. 10, 2018

(54) AREA SENSOR AND DISPLAY APPARATUS PROVIDED WITH AN AREA SENSOR

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Masato Yonezawa, Kanagawa (JP); Hajime Kimura, Kanagawa (JP); Yu Yamazaki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/641,556

(22) Filed: Jul. 5, 2017

(65) Prior Publication Data
US 2017/0309695 A1    Oct. 26, 2017

Related U.S. Application Data

(60) Continuation of application No. 15/145,863, filed on May 4, 2016, now Pat. No. 9,711,582, which is a (Continued)

(30) Foreign Application Priority Data
Aug. 10, 2000    (JP) .................. 2000-242932

(51) Int. Cl.
*H01L 29/49*    (2006.01)
*H01L 27/32*    (2006.01)
(Continued)

(52) U.S. Cl.
CPC ....... *H01L 27/3269* (2013.01); *G09G 3/3258* (2013.01); *G09G 3/3266* (2013.01);
(Continued)

(58) Field of Classification Search
CPC .......... H01L 27/3269; H01L 27/14623; H01L 27/14643; H01L 27/14678;
(Continued)

(56) References Cited

U.S. PATENT DOCUMENTS 4,213,074 A    7/1980   Kawaguchi et al.
4,784,702 A    11/1988  Henri
(Continued)

FOREIGN PATENT DOCUMENTS

EP    0296725 A    12/1988
EP    0923067 A    6/1999
(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.
(Continued)

*Primary Examiner* — Michael Shingleton
(74) *Attorney, Agent, or Firm* — Fish & Richardson P.C.

(57) ABSTRACT

An area sensor of the present invention has a function of displaying an image in a sensor portion by using light-emitting elements and a reading function using photoelectric conversion devices. Therefore, an image read in the sensor portion can be displayed thereon without separately providing an electronic display on the area sensor. Furthermore, a photoelectric conversion layer of a photodiode according to the present invention is made of an amorphous silicon film and an N-type semiconductor layer and a P-type semiconductor layer are made of a polycrystalline silicon film. The amorphous silicon film is formed to be thicker than the polycrystalline silicon film. As a result, the photodiode according to the present invention can receive more light.

17 Claims, 25 Drawing Sheets

Related U.S. Application Data continuation of application No. 14/797,251, filed on Jul. 13, 2015, now Pat. No. 9,337,243, which is a continuation of application No. 13/760,121, filed on Feb. 6, 2013, now Pat. No. 9,082,677, which is a continuation of application No. 13/241,346, filed on Sep. 23, 2011, now Pat. No. 8,378,443, which is a continuation of application No. 12/754,702, filed on Apr. 6, 2010, now Pat. No. 8,058,699, which is a continuation of application No. 11/278,841, filed on Apr. 6, 2006, now Pat. No. 7,786,544, which is a division of application No. 09/924,108, filed on Aug. 8, 2001, now Pat. No. 7,030,551.

(51) Int. Cl.

| | | |
|---|---|---|
| *H01L 27/146* | (2006.01) | |
| *H01L 51/00* | (2006.01) | |
| *H04N 3/14* | (2006.01) | |
| *G09G 3/3266* | (2016.01) | |
| *G09G 3/3258* | (2016.01) | |
| *H01L 29/786* | (2006.01) | |
| *H01L 27/15* | (2006.01) | |
| *H04N 5/225* | (2006.01) | |

(52) U.S. Cl.
CPC .. *H01L 27/14623* (2013.01); *H01L 27/14632* (2013.01); *H01L 27/14643* (2013.01); *H01L 27/14678* (2013.01); *H01L 27/14687* (2013.01); *H01L 27/15* (2013.01); *H01L 27/323* (2013.01); *H01L 27/3234* (2013.01); *H01L 27/3246* (2013.01); *H01L 27/3248* (2013.01); *H01L 27/3258* (2013.01); *H01L 27/3262* (2013.01); *H01L 27/3265* (2013.01); *H01L 27/3276* (2013.01); *H01L 29/78672* (2013.01); *H01L 51/0097* (2013.01); *H04N 3/155* (2013.01); *H04N 5/2251* (2013.01); *G09G 2300/0809* (2013.01); *G09G 2310/0286* (2013.01); *G09G 2310/0291* (2013.01); *G09G 2320/0646* (2013.01); *H01L 27/3244* (2013.01); *H01L 2251/5338* (2013.01)

(58) Field of Classification Search
CPC . H01L 27/14687; H01L 27/15; H01L 27/323; H01L 27/3234; H01L 27/3246; H01L 27/3248; H01L 27/3258; H01L 27/3262; H01L 27/3265; H01L 27/3276; H01L 29/78672; G09G 3/3258; G09G 3/3266
See application file for complete search history.

(56) References Cited

U.S. PATENT DOCUMENTS

| | | |
|---|---|---|
| 4,806,748 A | 2/1989 | Takami et al. |
| 4,972,252 A | 11/1990 | Maekawa |
| 5,047,090 A | 9/1991 | Hayashi et al. |
| 5,262,654 A | 11/1993 | Yamazaki |
| 5,446,564 A | 8/1995 | Mawatari et al. |
| 5,501,989 A | 3/1996 | Takayama et al. |
| 5,589,694 A | 12/1996 | Takayama et al. |
| 5,627,364 A | 5/1997 | Codama et al. |
| 5,744,822 A | 4/1998 | Takayama et al. |
| 5,757,456 A | 5/1998 | Yamazaki et al. |
| 5,821,138 A | 10/1998 | Yamazaki et al. |
| 5,834,327 A | 11/1998 | Yamazaki et al. |
| 5,920,401 A | 7/1999 | Street et al. |
| 6,002,157 A | 12/1999 | Kozuka |
| 6,040,810 A | 3/2000 | Nishimura |
| 6,118,502 A | 9/2000 | Yamazaki et al. |
| 6,160,272 A | 12/2000 | Arai et al. |
| 6,188,380 B1 | 2/2001 | Kawashima et al. |
| 6,243,155 B1 | 6/2001 | Zhang et al. |
| 6,287,888 B1 | 9/2001 | Sakakura et al. |
| 6,376,333 B1 | 4/2002 | Yamazaki et al. |
| 6,380,673 B1 | 4/2002 | Sekiya et al. |
| 6,404,137 B1 | 6/2002 | Shodo |
| 6,420,758 B1 | 7/2002 | Nakajima |
| 6,462,806 B2 | 10/2002 | Zhang et al. |
| 6,476,864 B1 | 11/2002 | Borg et al. |
| 6,480,305 B1 | 11/2002 | Resman |
| 6,518,962 B2 | 2/2003 | Kimura et al. |
| 6,531,711 B2 | 3/2003 | Sakakura et al. |
| 6,692,984 B2 | 2/2004 | Yonezawa et al. |
| 6,747,638 B2 | 6/2004 | Yamazaki et al. |
| 6,803,601 B2 | 10/2004 | Nakajima |
| 6,825,492 B2 | 11/2004 | Yonezawa et al. |
| 6,864,950 B2 | 3/2005 | Zhang et al. |
| 6,998,282 B1 | 2/2006 | Yamazaki et al. |
| 7,042,548 B2 | 5/2006 | Zhang et al. |
| 7,050,138 B1 | 5/2006 | Yamazaki et al. |
| RE39,393 E | 11/2006 | Yamazaki |
| 7,202,499 B2 | 4/2007 | Nakajima |
| 7,214,555 B2 | 5/2007 | Yamazaki et al. |
| 7,265,811 B2 | 9/2007 | Zhang et al. |
| 7,271,858 B2 | 9/2007 | Yamazaki et al. |
| 7,361,519 B2 | 4/2008 | Yamazaki et al. |
| 7,375,782 B2 | 5/2008 | Yamazaki et al. |
| 7,425,931 B1 | 9/2008 | Yamazaki et al. |
| 7,446,843 B2 | 11/2008 | Yamazaki et al. |
| 7,525,615 B2 | 4/2009 | Zhang et al. |
| 7,859,621 B2 | 12/2010 | Zhang et al. |
| 2002/0011972 A1 | 1/2002 | Yamazaki et al. |
| 2004/0217928 A1 | 11/2004 | Yamazaki et al. |
| 2015/0303219 A1* | 10/2015 | Tada ............... G02F 1/13452 349/43 |

FOREIGN PATENT DOCUMENTS

| | | |
|---|---|---|
| JP | 63-094671 A | 4/1988 |
| JP | 63-207183 A | 8/1988 |
| JP | 64-002376 A | 1/1989 |
| JP | 02-159772 A | 6/1990 |
| JP | 02-222582 A | 9/1990 |
| JP | 04-206969 A | 7/1992 |
| JP | 05-094150 A | 4/1993 |
| JP | 05-219301 A | 8/1993 |
| JP | 06-275807 A | 9/1994 |
| JP | 11-065763 A | 3/1999 |
| JP | 11-125841 A | 5/1999 |
| JP | 11-204817 A | 7/1999 |
| JP | 2000-114566 A | 4/2000 |
| JP | 2000-216399 A | 8/2000 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Steer.W et al., "Systems Aspects of Active-Matrix Polymer LED Displays", AM-LCD '03 Digest of Technical Papers, 2003, pp. 285-288.

Tsutsui.T et al., "Electroluminescence in Organic Thin Films", Photochemical Processes in Organized Molecular Systems, 1991, pp. 437-450.

Tsutsui.T et al., "High Quantum Efficiency in Organic Light-Emitting Devices With Iridium-Complex As a Triplet Emissive Center", Jpn. J. Appl. Phys. (Japanese Journal of Applied Physics), Dec. 15, 1999, vol. 38, No. 12B, pp. L1502-L1504.

"58.2 Photodiodes", The Electronics Handbook, 1996, pp. 851-853.

* cited by examiner

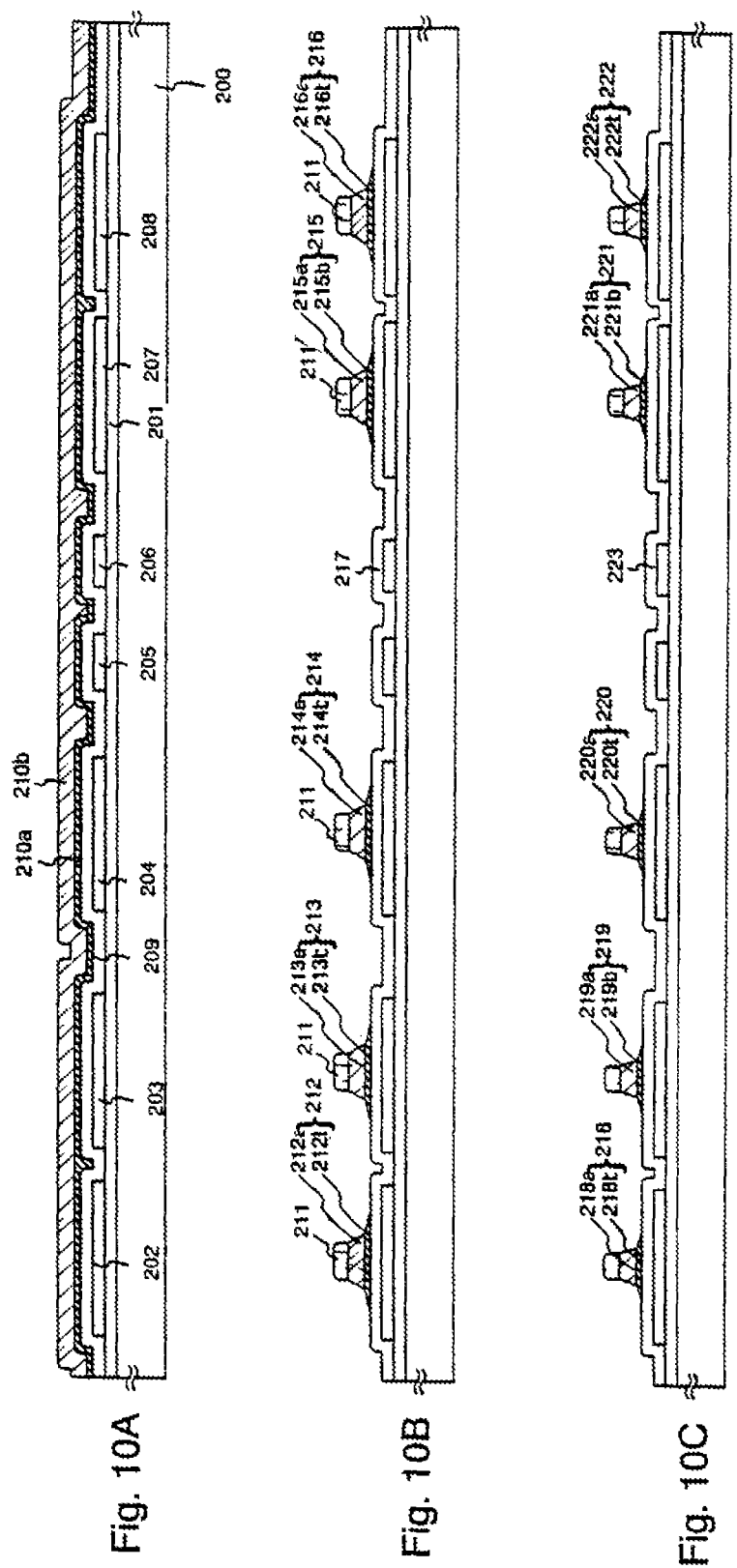

AREA SENSOR AND DISPLAY APPARATUS PROVIDED WITH AN AREA SENSOR

CROSS-REFERENCE TO RELATED APPLICATIONS

This application is a continuation of U.S. application Ser. No. 15/145,863, filed May 4, 2016, now allowed, which is a continuation of U.S. application Ser. No. 14/797,251, filed Jul. 13, 2015, now U.S. Pat. No. 9,337,243, which is a continuation of U.S. application Ser. No. 13/760,121, filed Feb. 6, 2013, now U.S. Pat. No. 9,082,677, which is a continuation of U.S. application Ser. No. 13/241,346, filed Sep. 23, 2011, now U.S. Pat. No. 8,378,443, which is a continuation of U.S. application Ser. No. 12/754,702, filed Apr. 6, 2010, now U.S. Pat. No. 8,058,699, which is a continuation of U.S. application Ser. No. 11/278,841, filed Apr. 6, 2006, now U.S. Pat. No. 7,786,544, which is a divisional of U.S. application Ser. No. 09/924,108, filed Aug. 8, 2001, now U.S. Pat. No. 7,030,551, which claims the benefit of a foreign priority application filed in Japan as Serial No. 2000-242932 on Aug. 10, 2000, all of which are incorporated by reference.

BACKGROUND OF THE INVENTION

1. Field of the Invention

The present invention relates to an area sensor (semiconductor device) having an image sensor function and a display function. In particular, the present invention relates to an area sensor (semiconductor device) that has EL (electroluminescence) elements as a light source and is composed of photoelectric conversion devices provided on a flat surface (insulating surface) and a plurality of thin film transistors (TFTs) arranged in a matrix.

2. Description of the Related Art

In recent years, a solid-state image sensing device is being used, which has diodes, CCDs, or the like for reading an electric signal having image information from a light signal having textural/graphic information, video information, and the like on a sheet of paper. Such a solid-state image sensing device is used for a scanner, a digital camera, and the like.

The solid-state image sensing device having photoelectric conversion devices are classified into a line sensor and an area sensor. In the line sensor, photoelectric conversion devices provided in a line shape are scanned with respect to a subject, whereby image information is captured as an electric signal.

The area sensor is also called a contact-type area sensor, in which photoelectric conversion devices provided on a flat surface are disposed on a subject, and image information is captured as an electric signal. Unlike the line sensor, it is not required to scan photoelectric conversion devices in the area sensor, so that a motor and the like for scanning are not necessary.

FIGS. 23A and 23B show a configuration of a conventional area sensor. FIG. 23A is a perspective view of the area sensor, and FIG. 23B is a cross-sectional view thereof. A sensor substrate 2501 with photoelectric conversion devices formed thereon, a backlight 2502, and a light scattering plate 2503 are provided as shown in FIG. 23B.

Light from the backlight 2502 (light source) is refracted in the light scattering plate 2503, and is radiated to a subject 2504. The radiated light is reflected from the subject 2504, and radiated to the photoelectric conversion devices provided on the sensor substrate 2501. When the photoelectric conversion devices are irradiated with light, a current with a magnitude in accordance with the brightness of light is generated in the photoelectric conversion devices, and image information of the subject 2504 is captured in the area sensor as an electric signal.

In the above-mentioned area sensor, when light is not radiated uniformly to the subject from the backlight 2502, a read image may partially become light or dark, resulting in inconsistencies of the image. This makes it necessary to design the light scattering plate 2503 so that light is radiated uniformly to the subject 2504, and to precisely adjust the position of the backlight 2502, the light scattering plate 2503, the sensor substrate 2501, and the subject 2504.

It is also difficult to minimize the size of the backlight 2502 and the light scattering plate 2503, which prevents the area sensor from becoming small, thin, and light-weight.

SUMMARY OF THE INVENTION

Therefore, with the foregoing in mind, it is an object of the present invention to provide an area sensor that is small, thin, and light-weight, and in which a read image has no inconsistencies in lightness.

An area sensor of the present invention uses a photodiode as a photoelectric conversion device. The area sensor also uses an electroluminescense (EL) element as a light source.

In the present specification, a photodiode (photoelectric conversion device) includes an N-type semiconductor layer, a P-type semiconductor layer, and a photoelectric conversion device provided so as to come into contact with a part of the N-type semiconductor layer and the P-type semiconductor layer.

When a photodiode is irradiated with light, the voltage thereof is decreased due to carriers generated by the light. At this time, as light intensity is higher, the amount of a decrease in voltage becomes larger. Furthermore, by comparing a voltage in the case where a photodiode is irradiated with light, with a voltage in the case where the photodiode is not irradiated with light, a signal is input to a sensor signal line.

An EL element (light-emitting element) is a spontaneous light-emitting element, and is mainly used for an EL display. An EL display is also called an organic EL display (OELD) or an organic light-emitting diode (OLED).

An EL element has a configuration in which an EL layer (organic compound layer) is interposed between a pair of electrodes (positive electrode and negative electrode), and the EL layer usually has a multi-layer configuration. Typically, there is a multi-layer configuration "hole transport layer/light-emitting layer/electron transport layer" proposed by Tang of Eastman Kodak. This configuration has a very high light-emitting efficiency, and most of the EL display apparatuses that are being studied and developed adopt this configuration.

Alternatively, an EL layer may have a configuration in which a hole injection layer, a hole transport layer, a light-emitting layer, and an electron transport layer are stacked in this order on an electrode or a configuration in which a hole injection layer, a hole transport layer, a light-emitting layer, an electron transport layer, and an electron injection layer are stacked in this order on an electrode. A light-emitting layer may be doped with a fluorescent colorant or the like.

In the present specification, all the layers provided between a pair of electrodes are collectively referred to as an "EL layer (organic compound layer)". Therefore, the above-mentioned hole injection layer, hole transport layer, light-emitting layer, electron transport layer, electron injection layer, etc. are all included in the EL layer. A predetermined voltage is applied to an EL layer with the above-mentioned configuration through a pair of electrodes, whereby carriers are recombined in a light-emitting layer to emit light.

In the present specification, an EL element (light-emitting element) has a configuration in which an organic compound layer is interposed between a pair of electrodes (positive electrode and negative electrode). The organic compound layer can be made of a known light-emitting material. Furthermore, the organic compound layer can have a single-layer configuration and a multi-layer configuration. According to the present invention the organic compound layer may have either configuration. As luminescence in the organic compound layer, there are light emission (fluorescence) occurring when a singlet excited state is changed to a ground state and light emission (phosphorescence) occurring when a triplet excited state is changed to a ground state. According to the present invention, either light emission may be used.

Photodiodes and EL elements are provided on the same sensor substrate in a matrix. The photodiodes and the EL elements are controlled for operation, respectively, using thin film transistors (TFTs) similarly provided on the substrate in a matrix.

Light emitted from the EL elements is reflected from a subject and radiated to the photodiodes. A current is generated by the light radiated to the photodiodes, and an electric signal (image signal) having image information of the subject is captured by an area sensor.

According to the present invention, due to the above-mentioned configuration, light is radiated uniformly to a subject, so that no inconsistencies in lightness are caused in a read image. Furthermore, it is not required to provide a backlight and a light scattering plate separately from a sensor substrate. Therefore, unlike a conventional example, an area sensor can be made small, thin, and light-weight without precisely adjusting the position of a backlight, a light scattering plate, a sensor substrate, and a subject. Furthermore, the mechanical strength of an area sensor is increased.

The area sensor of the present invention is also capable of displaying an image, using the EL elements. The EL elements in the present invention have a function as a light source for reading an image and a function as a light source for displaying an image. Therefore, even when an electronic display is not provided separately on the area sensor, an image can be displayed.

Examples of a film made of silicon include a single crystal silicon film, a polycrystalline silicon film (polysilicon film), an amorphous silicon film (amorphous silicon film), etc. In the photodiode according to the present invention, a photoelectric conversion layer is made of an amorphous silicon film (amorphous silicon film), an N-type semiconductor layer is made of an N-type polycrystalline silicon film (polysilicon film), and a P-type semiconductor layer is made of a polycrystalline silicon film (polysilicon film). The amorphous silicon film is thicker than the polycrystalline silicon film, and the ratio in thickness therebetween is preferably (1 to 10):1. In the photodiode used in the present invention, a photoelectric conversion layer can receive more light when the thickness of the amorphous silicon film is larger than that of the polycrystalline silicon film.

According to the present invention, a photoelectric conversion layer is made of an amorphous silicon film due to its high light absorptivity.

In a photodiode, a dark current (i.e., current flowing at a light intensity of 0) may flow even when light is not radiated to the photodiode. However, due to a high resistance of an amorphous silicon film, a current does not flow even under the condition of dark light, whereby a dark current can be decreased. More specifically, when a dark current is small, a range of lightness and darkness of light which a photodiode can receive is enlarged in the case of dark light.

As shown in FIG. 16, a metal film 280 can also be formed so as to cover a first interlayer insulating film 250 provided on a photoelectric conversion layer 248.

Light is radiated to a subject 270 from an EL element, and light reflected form the subject 270 is radiated to a photodiode 306. However, in this case, among light passing through the photodiode 306, there exists light that is not radiated to the photoelectric conversion layer 248. If the metal film 280 is present as shown in FIG. 16, such light is reflected from the metal film 280, whereby the photoelectric conversion layer 248 can receive it. Because of this, the photoelectric conversion layer 248 can receive more light.

Hereinafter, the constitution of the present invention will be described.

According to the present invention, there is provided an area sensor, characterized in that:

the sensor comprises a sensor portion provided with a plurality of pixels each including a photodiode, an EL element, and a plurality of thin film transistors;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided an area sensor, characterized in that:

the sensor comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, and a selective TFT;

the switching TFT and the EL driving TFT control light emission of the EL element; light emitted from the EL element is reflected from a subject to be radiated to the photodiode;

the photodiode, the reset TFT, the buffer TFT, and the selective TFT generate an image signal from the light radiated to the photodiode;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided an area sensor, characterized in that:

the area sensor comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line, light emitted from the EL element is reflected from a subject to be radiated to the photodiode, an image signal generated from the light radiated to the photodiode is input to the sensor output line, the photodiode includes a photoelectric conversion layer that is in contact with a part of a P-type semiconductor layer and an N-type semiconductor layer, and is made of an amorphous semiconductor film, and the photoelectric conversion layer is thicker than the P-type semiconductor layer and the N-type semiconductor layer.

According to the present invention, there is provided an area sensor, characterized in that:

the area sensor comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

a polarity of the switching TFT is the same as that of the selective TFT;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided an area sensor, characterized in that:

the area sensor comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

the reset TFT and the selective TFT are switched from an ON state to an OFF state or from an OFF state to an ON state by a signal input to the reset gate signal line and the sensor gate signal line;

when one of the reset TFT and the selective TFT is in an ON state, the other is in an OFF state;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided an area sensor, characterized in that:

the area sensor comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

a polarity of the switching TFT is the same as that of the selective TFT;

the reset TFT and the selective TFT are switched from an ON state to an OFF state or from an OFF state to an ON state by a signal input to the reset gate signal line and the sensor gate signal line;

when one of the reset TFT and the selective TFT is in an ON state, the other is in an OFF state;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the photodiode includes a photoelectric conversion layer that is in contact with a part of a P-type semiconductor layer and an N-type semiconductor layer and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, and a selective TFT;

the switching TFT and the EL driving TFT controls light emission of the EL element; light emitted from the EL element is reflected from a subject to be radiated to the photodiode;

the photodiode, the reset TFT, the buffer TFT, and the selective TFT generate an image signal from the light radiated to the photodiode;

the photodiode includes a photoelectric conversion layer that is in contact with a part of a P-type semiconductor layer and an N-type semiconductor layer and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

a polarity of the switching TFT is the same as that of the selective TFT;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

According to the present invention, there is provided a display device, characterized in that:

the display apparatus comprises a sensor portion provided with a plurality of pixels each including a photodiode, an EL element, and a plurality of thin film transistors;

the pixel includes a photodiode, an EL element, a switching TFT, an EL driving TFT, a reset TFT, a buffer TFT, a selective TFT, a source signal line, a gate signal line, a power supply line kept at a constant potential, a reset gate signal line, a sensor gate signal line, a sensor output line connected to a constant current power source, and a sensor power source line kept at a constant potential;

a gate electrode of the switching TFT is connected to the gate signal line;

one of a source region and a drain region of the switching TFT is connected to the source signal line, and the other is connected to a gate electrode of the EL driving TFT;

a source region of the EL driving TFT is connected to the power supply line, and a drain region of the EL driving TFT is connected to the EL element;

a source region of the reset TFT is connected to the sensor power source line;

a drain region of the reset TFT is connected to a gate electrode of the buffer TFT and the photodiode;

a drain region of the buffer TFT is connected to the sensor power source line;

one of a source region and a drain region of the selective TFT is connected to the sensor output line, and the other is connected to a source region of the buffer TFT;

a gate electrode of the selective TFT is connected to the sensor gate signal line;

a polarity of the switching TFT is the same as that of the selective TFT;

the reset TFT and the selective TFT are switched from an ON state to an OFF state or from an OFF state to an ON state by a signal input to the reset gate signal line and the sensor gate signal line;

when one of the reset TFT and the selective TFT is in an ON state, the other is in an OFF state;

light emitted from the EL element is reflected from a subject to be radiated to the photodiode;

an image signal generated from the light radiated to the photodiode is input to the sensor output line;

the photodiode includes a photoelectric conversion layer that is in contact with a part of a P-type semiconductor layer and an N-type semiconductor layer, and is made of an amorphous semiconductor film; and the photoelectric conversion layer is thicker than the P-type semiconductor layer and the N-type semiconductor layer.

These and other advantages of the present invention will become apparent to those skilled in the art upon reading and understanding the following detailed description with reference to the accompanying figures.

BRIEF DESCRIPTION OF THE DRAWINGS

In the accompanying drawings:

FIGS. 10A to 10C show the steps of producing the sensor portion;

DETAILED DESCRIPTION OF THE PREFERRED EMBODIMENTS

Figure 1:
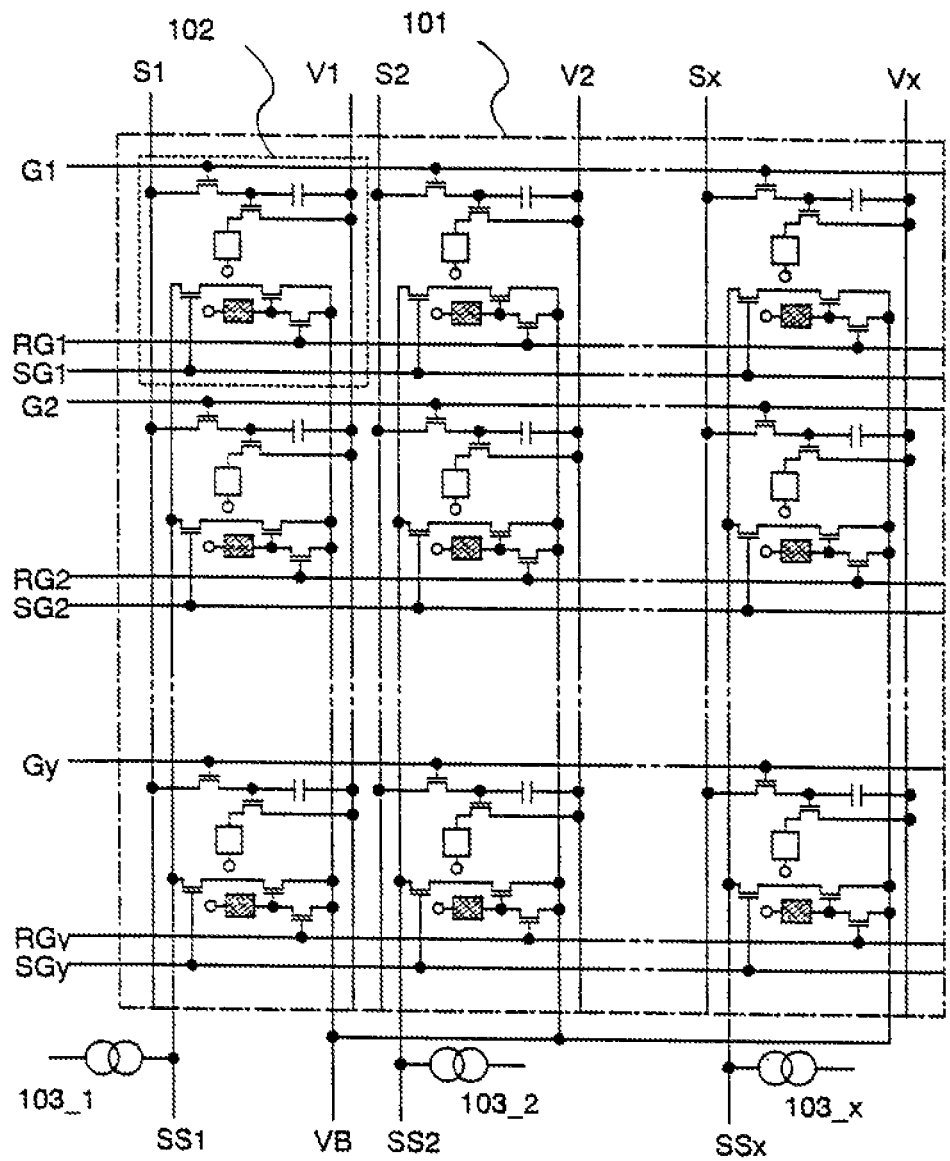
FIG. 1 is a circuit diagram of a sensor portion.

Hereinafter, the structure of an area sensor (semiconductor device) of the present invention will be described. The area sensor of the present invention includes a sensor portion for reading an image and a driving portion for controlling driving of the sensor portion. FIG. 1 shows a circuit diagram of the sensor portion according to the present invention.

A sensor portion 101 is provided with source signal lines $S_1$ to $S_x$, power supply lines $V_1$ to $V_x$, gate signal lines $G_1$ to $G_y$, reset gate signal lines $RG_1$ to $RG_y$, sensor gate signal lines $SG_1$ to $SG_y$, sensor output lines $SS_1$ to $SS_x$, and a sensor power source line VB.

The sensor portion 101 has a plurality of pixels 102. Each pixel 102 includes one of the source signal lines $S_1$ to $S_x$, one of the power supply lines $V_1$ to $V_x$, one of the gate signal lines $G_1$ to $G_y$, one of reset the gate signal lines $RG_1$ to $RG_y$, one of the sensor gate signal lines $SG_1$ to $SG_y$, one of the sensor output lines $SS_1$ to $SS_x$, and the sensor power source line VB.

The sensor output lines $SS_1$ to $SS_x$ are respectively connected to constant current power sources 103_1 to 103_x.

Figure 2:
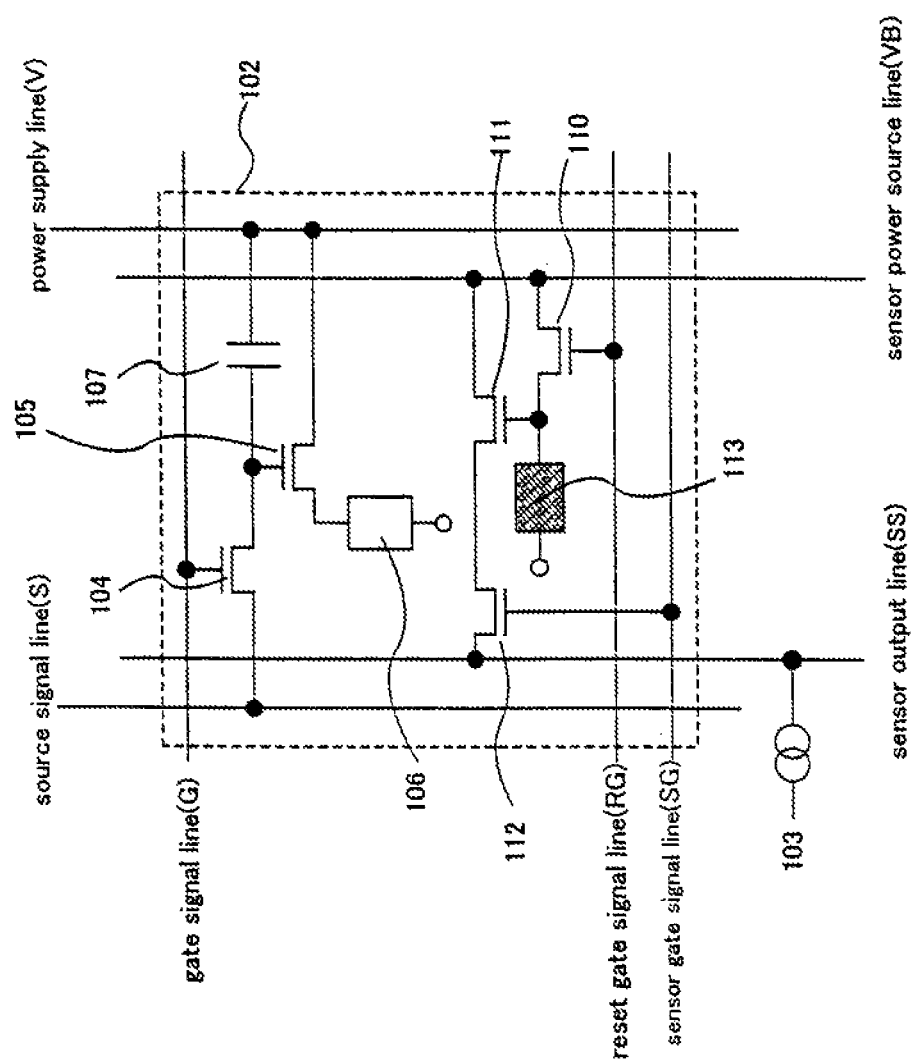
FIG. 2 is a circuit diagram of a pixel.

FIG. 2 shows a detailed configuration of the pixel 102. A region surrounded by a dotted line is the pixel 102. A source signal line S denotes one of the source signal lines $S_1$ to $S_x$. A power supply line V denotes one of the power supply lines $V_1$ to $V_x$. A gate signal line G denotes one of the gate signal lines $G_1$ to $G_y$. A reset gate signal line RG denotes one of the reset gate signal lines $RG_1$ to $RG_y$. A sensor gate signal line SG denotes one of the sensor gate signal lines $SG_1$ to $SG_y$. A sensor output line SS denotes one of sensor output lines $SS_1$ to $SS_x$.

The pixel 102 includes a switching TFT 104, an EL driving TFT 105, and an EL element 106. In FIG. 2, although a capacitor 107 is provided in the pixel 102, the capacitor 107 may not be provided.

The EL element 106 is composed of a positive electrode, a negative electrode, and an EL layer provided between the positive electrode and the negative electrode. In the case where the positive electrode is connected to a source region or a drain region of the EL driving TFT 105, the positive electrode functions as a pixel electrode and the negative electrode functions as a counter electrode. In contrast, in the case where the negative electrode is connected to a source region or a drain region of the EL driving TFT 105, the positive electrode functions as a counter electrode and the negative electrode functions as a pixel electrode.

A gate electrode of the switching TFT 104 is connected to the gate signal line G. One of a source region and a drain region of the switching TFT 104 is connected to the source signal line S, and the other is connected to the gate electrode of the EL driving TFT 105.

The source region of the EL driving TFT 105 is connected to the power supply line V, and the drain region of the EL driving TFT 105 is connected to the EL element 106. The capacitor 107 is provided so as to be connected to the gate electrode of the EL driving TFT 105 and the power supply line V.

The pixel 102 further includes a reset TFT 110, a buffer TFT 111, a selective TFT 112, and a photodiode 113.

A gate electrode of the reset TFT 110 is connected to the reset gate signal line RG. A source region of the reset TFT 110 is connected to the sensor power source line VB. The sensor power source line VB is always kept at a constant electric potential (reference potential). A drain region of the reset TFT 110 is connected to the photodiode 113 and a gate electrode of the buffer TFT 111.

Although not shown in the figure, the photodiode 113 has an N-type semiconductor layer, a P-type semiconductor layer, and a photoelectric conversion layer provided between the N-type semiconductor layer and the P-type semiconductor layer. The drain region of the reset TFT 110 is connected to either the P-type semiconductor layer or the N-type semiconductor layer of the photodiode 113.

A drain region of the buffer TFT 111 is connected to the sensor power source line VB, and is always kept at a constant reference potential. A source region of the buffer TFT 111 is connected to a source region or a drain region of the selective TFT 112.

A gate electrode of the selective TFT 112 is connected to the sensor gate signal line SG. One of a source region and a drain region of the selective TFT 112 is connected to the source region of the buffer TFT 111 as described above, and the other is connected to the sensor output line SS. The sensor output line SS is connected to the constant current power source 103 (one of the constant current power sources 103_1 to 103_x), and is always supplied with a constant current.

Hereinafter, a method for driving the area sensor of the present invention will be briefly described with reference to FIGS. 1 and 2.

The EL element 106 of the pixel 102 functions as a light source of the area sensor, and the switching TFT 104, the EL driving TFT 105, and the capacitor 107 control the operation of the EL element 106 as a light source.

Light emitted from the EL element 106 is reflected from a subject, and radiated to the photodiode 113 of the pixel 102. The photodiode 113 transforms the radiated light into an electric signal having image information. The electric signal having image information generated in the photodiode 113 is captured in the area sensor as an image signal by the reset TFT 110, the buffer TFT 111, and the selective TFT 112.

Figure 3:
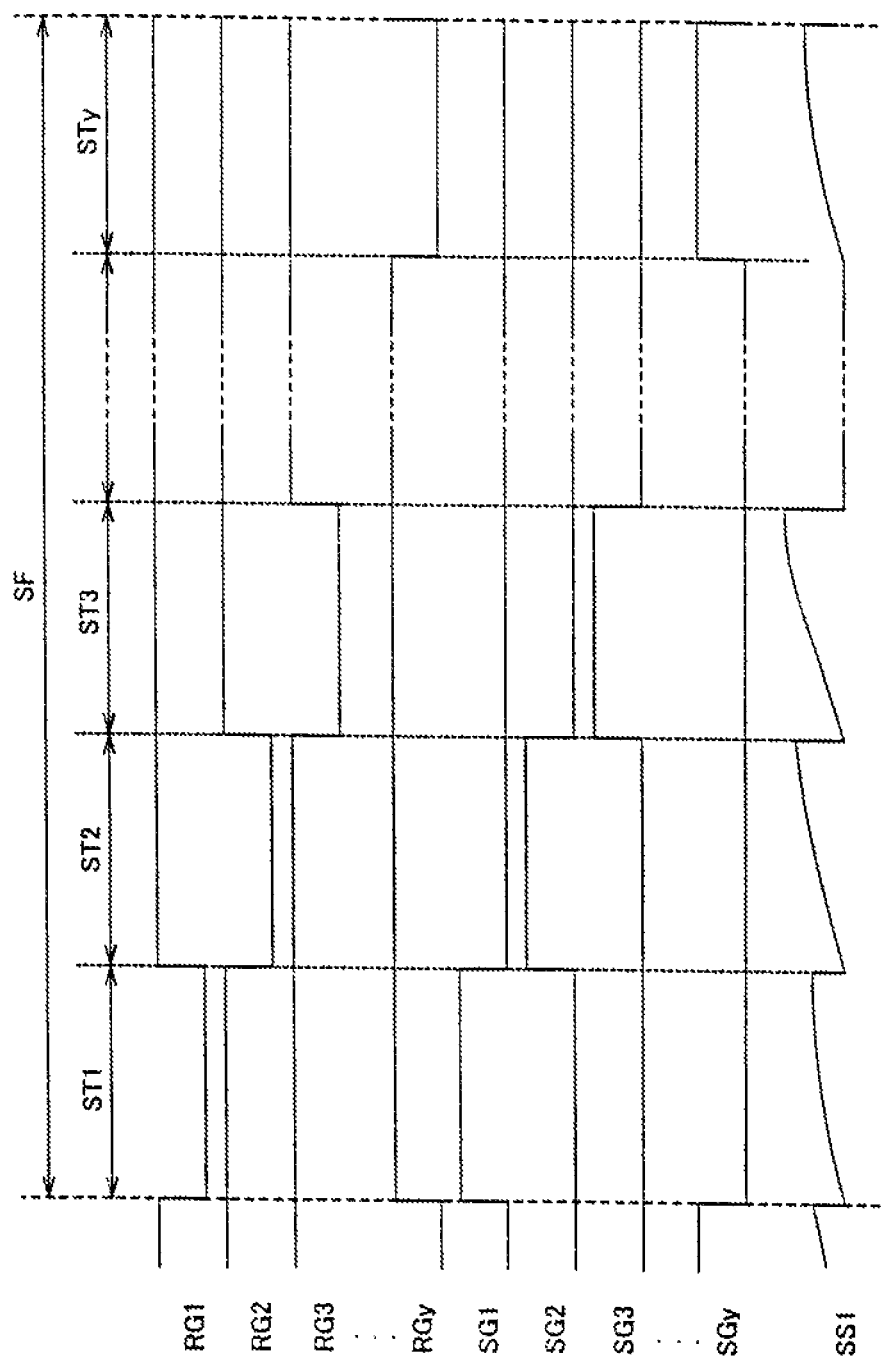
FIG. 3 is a timing chart of reading of an image in the sensor portion.

FIG. 3 is a timing chart showing the operation of the reset TFT 110, the buffer TFT 111, and the selective TFT 112. FIG. 3 shows a timing chart in which the reset TFT 110 is an N-channel type TFT, the buffer TFT 111 is a P-channel type TFT, and the selective TFT 112 is an N-channel type TFT. According to the present invention, the reset TFT 110, the buffer TFT 111, and the selective TFT 112 may be an N-channel type TFT or a P-channel type TFT. It is preferable that the polarity of the reset TFT 110 is opposite to that of the buffer TFT 111.

First, the reset TFTs 110 for pixels in the first line, connected to the reset gate signal Line $RG_1$, are turned on with a reset signal input to the reset gate signal line $RG_1$. Then, the reference potential of the sensor power source line VB is given to the gate electrodes of the buffer TFTs 111.

The selective TFTs 112 for the pixels in the first line, connected to the sensor gate signal line $SG_1$ are turned off with a sensor signal input to the sensor gate signal line $SG_1$. Thus, the source region of each buffer TFT 111 is kept at an electric potential obtained by subtracting a potential difference $V_{GS}$ between the source region and the gate region of the buffer TFT 111 from the reference potential. In the present specification, a period during which the reset TFTs 110 are in an ON state is referred to as a reset period.

Then, the electric potential of the reset signal input to the reset gate signal line $RG_1$ is changed, whereby all of the reset TFTs 110 for the pixels in the first line are turned off. As a result, the reference potential of the sensor power source line VB is not given to each gate electrode of the buffer TFTs 111 for the pixels in the first line. In the present specification, a period during which the reset TFTs 110 are in an OFF state is referred to as a sampling period ST. In particular, a period during which the reset TFTs 110 for the pixels in the first line are in an OFF state is referred to as a sampling period $ST_1$.

During the sampling period $ST_1$, the electric potential of the sensor signal input to the sensor gate signal line $SG_1$ is changed, and the selective TFTs 112 for the pixels in the first line are turned on. Thus, the source regions of the buffer TFTs 111 for the pixels in the first line are electrically connected to the sensor output line $SS_1$ via the selective TFTs 112. The sensor output line $SS_1$ is connected to the constant current power sources 103_1. Therefore, each buffer TFT 111 functions as a source follower, whereby the potential difference $V_{GS}$ between the source region and the gate region of the buffer TFT 111 becomes constant.

When light emitted from the EL elements 106 is reflected from a subject and radiated to the photodiodes 113 during the sampling period $ST_1$, a current flows through the photodiodes 113. Therefore, the electric potential of the gate electrodes of the buffer TFTs 111 kept at the reference potential during the reset period is increased in accordance with the magnitude of a current generated in the photodiodes 113.

A current flowing through each photodiode 113 is proportional to the intensity of light radiated to the photodiode 113. Therefore, image information of the subject is transformed to an electric signal as it is by the photodiode 113. The electric signal generated in the photodiode 113 is input to the gate electrode of the buffer TFT 111.

The potential different $V_{GS}$ between the source region and the gate region of the buffer TFT 111 is always kept constant. Therefore, the source region of the buffer TFT 111 is kept at an electric potential obtained by subtracting the potential difference $V_{GS}$ from the electric potential of the gate electrode of the buffer TFT 111. Consequently, when the electric potential of the gate electrode of the buffer TFT 111 is changed, the electric potential of the source region of the buffer TFT 111 is also changed in accordance therewith.

The electric potential of the source region of the buffer TFT 111 is input of the sensor output line $SS_1$ via the selective TFT 112 as an image signal.

Next, the reset TFTs 110 for the pixels in the first line, connected to the reset gate signal line $RG_1$, are turned on with a reset signal input to the reset gate signal line $RG_1$, and a reset period is obtained again. Simultaneously, the reset TFTs 110 for pixels in the second line, connected to the reset gate signal line RG 2, are turned off with a reset signal input to the reset gate signal line $RG_2$, whereby a sampling period $ST_2$ starts.

During the sampling period $ST_2$, in the same way as in the sampling period $ST_1$, an electric signal having image information is generated in the photodiodes, and an image signal is input to the sensor output line $SS_2$.

When the above-mentioned operation is repeated, and the sampling period $ST_y$ is completed, one image can be read as an image signal. In the present specification, a period during which all the sampling periods $ST_1$ to $ST_y$ are completed is referred to as a sensor frame period SF.

During each sampling period, it is required to allow the EL element of each pixel to emit light. For example, it is important that the EL elements of the pixels in the first line emit light during at least the sampling period $ST_1$. All the pixels may emit light during the sensor frame period SF.

In the case of an area sensor for reading a color image, a sensor portion has pixels corresponding to red (R), green (G), and blue (B) colors. Pixels corresponding to RGB colors have three kinds of EL elements corresponding to RGB colors. Alternatively, they have an EL element for emitting white light and three kinds of RGB color filters. Alternatively they have an EL element for emitting blue light or blue-green light and a phosphor (fluorescent color transforming layer: CCM).

Light with RGB colors emitted from the pixels corresponding to RGB colors is radiated to a subject successively. Light of each of RGB colors reflected from the subject is radiated to photodiodes of the pixels, and image signals corresponding to RGB colors are captured in the area sensor.

Figure 4:
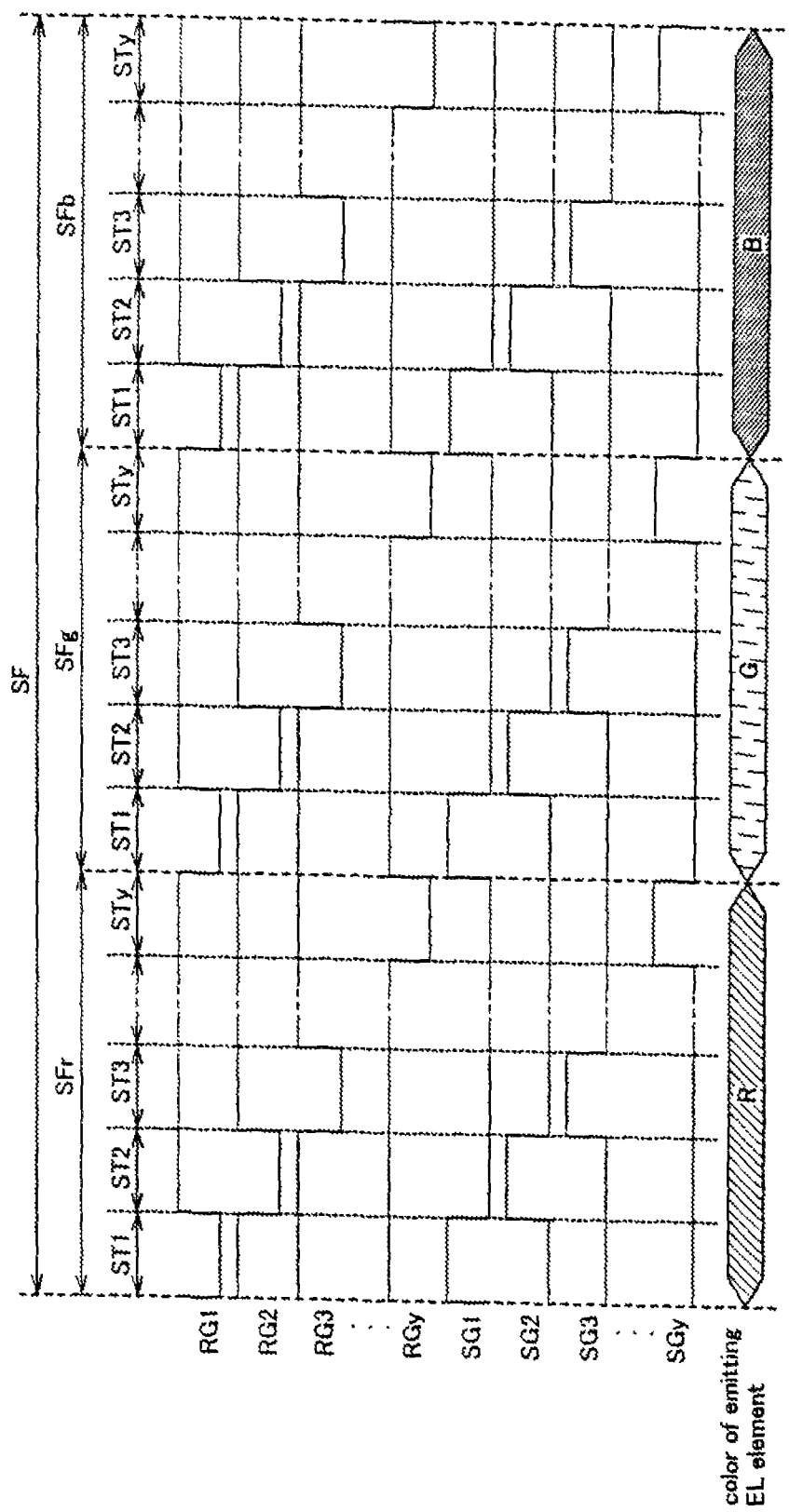
FIG. 4 is a timing chart of reading of a color image in the sensor portion.

FIG. 4 shows a timing chart showing the operation of the reset TFT 110, the buffer TFT 111, and the selective TFT 112 of the area sensor for reading a color image. FIG. 4 shows a timing chart in which the reset TFT 110 is an N-channel type TFT, the buffer TFT 111 is a P-channel type TFT, and the selective TFT 112 is an N-channel type TFT.

While EL elements of pixels corresponding to R emit light, all the sampling periods $ST_1$ to $ST_y$ appear. A period during which all the sampling periods $ST_1$ to $ST_y$ are completed during a period in which the EL elements of the pixels corresponding to R emit light is referred to as an R sensor frame period $SF_r$. During the R sensor frame period $SF_r$, an image signal corresponding to R is captured in the area sensor. During the R sensor frame $SF_r$, pixels corresponding to G and B do not emit light.

Next, while EL elements of the pixels corresponding to G emit light, all the sampling periods $TS_1$ to $ST_y$ appear. A period during which all the sampling periods $ST_1$ to $ST_y$ are completed during a period in which the EL elements of the pixels corresponding to G emit light is referred to as a G sensor frame period $SF_g$. During the G sensor frame period $SF_g$, an image signal corresponding to G is captured in the area sensor. During the G sensor frame $SF_g$, pixels corresponding to R and B do not emit light.

Next, while EL elements of the pixels corresponding to B emit light, all the sampling periods $TS_1$ to $ST_y$ appear. A period during which all the sampling periods $ST_1$ to $ST_y$ are completed during a period in which the EL elements of the pixels corresponding to B emit light is referred to as a B sensor frame period $SF_b$. During the B sensor frame period $SF_b$, an image signal corresponding to B is captured in the area sensor. During the B sensor frame $SF_b$, pixels corresponding to R and G do not emit light.

A period during which all the R sensor frame period $SF_r$, the G sensor frame period $SF_g$, and the B sensor frame period $SF_b$ are completed is a sensor frame period SF. When the sensor frame period SF is completed, one color image can be read as an image signal.

Furthermore, during each sampling period, it is required to allow the EL elements of the pixels corresponding to each color to always emit light. For example, during the sampling period $ST_1$ in the B sensor frame period, it is important that the EL elements of the pixels corresponding to B among those in the first line always emit light. Pixels corresponding to each color may always emit light during each of the R, G, and B sensor frame period ($SF_r$, $SF_g$, $SF_b$).

According to the present invention, due to the above-mentioned constitution, light is radiated uniformly to a subject. Therefore, inconsistencies are not caused in lightness of a read image. It is not required to provide a backlight and a light scattering plate separately from a sensor substrate (i.e., substrate having an insulating surface on which EL elements and photoelectric conversion devices are provided). Therefore, unlike the conventional example, an area sensor itself can be made small, thin, and light-weight without precisely adjusting the position of the backlight, the light scattering plate, the sensor substrate, and the subject. The mechanical strength of the area sensor itself is also increased.

Furthermore, the area sensor of the present invention is capable of displaying an image in a sensor portion, using EL elements (light source). Therefore, an image read by photodiodes can be displayed in the sensor portion without separately providing an electronic display on an area sensor, and a read image can be confirmed as soon as it is read.

EMBODIMENTS

Hereinafter, the present invention will be described by way of illustrative embodiments with reference to the drawings.

Embodiment 1

A method of driving the switching TFT 104 and the EL driving TFT 105, which control the operation of the EL element 106 shown in FIG. 2, is explained in Embodiment 1. Note that the structure of the sensor portion is the same as that of the embodiment mode, and therefore FIG. 1 and FIG. 2 are referenced.

Figure 5:
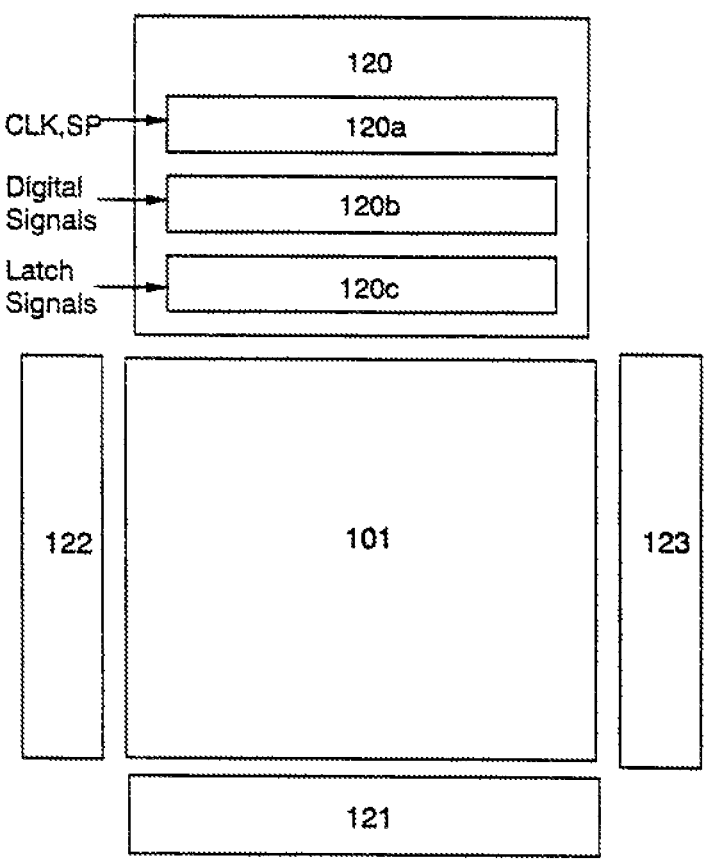
FIG. 5 is a top view of an area sensor for digital driving.

FIG. 5 shows a top view of an area sensor of Embodiment 1. Reference numeral 120 denotes a source signal line driving circuit, reference numeral 122 denotes a gate signal line driving circuit, and both control the driving of the switching TFT 104 and the EL driving TFT 105. Further, reference numeral 121 denotes a sensor source signal line driving circuit, reference numeral 123 denotes a sensor gate signal line driving circuit, and both control the driving of the reset TFT 110, the buffer TFT 111, and the selection TFT 112. Note that the source signal line driving circuit 120, the gate signal line driving circuit 122, the sensor source signal line driving circuit 121, and the sensor gate signal line driving circuit 123 are referred to as a driving portion.

The source signal line driving circuit 120 has a shift register 120a, a latch (A) 120b, and a latch (B) 120c. A clock signal (CLK) and a start pulse (SP) are inputted to the shift register 120a in the source signal line driving circuit 120. The shift register 120a generates timing signals in order based upon the clock signal (CLK) and the start pulse (SP), and the timing signals are supplied one after another to downstream circuits.

Note that the timing signals from the shift register 120a may be buffer-amplified by a circuit such as a buffer (not shown in the figure) and then supplied one after another to the downstream circuits as the buffer-amplified timing signals. The load capacitance (parasitic capacitance) of a wiring to which the timing signals are supplied is large because many of the circuits and elements are connected to the wiring. The buffer is formed in order to prevent dullness in the rise and fall of the timing signal, generated due to the large load capacitance.

The timing signals from the shift register 120a are supplied to the latch (A) 120b. The latch (A) 120b has a plurality of latch stages for processing a digital signal. The latch (A) 120b writes in and maintains digital signals in order simultaneously with the input of the timing signals.

Note that the digital signals may be sequentially inputted to the plurality of latch stages of the latch (A) 120b when the digital signals are taken in by the latch (A) 120b. However, the present invention is not limited to this structure. A so-called division drive may be performed, that is, the plurality of latch stages of the latch (A) 120b is divided into a number of groups, and then the digital signals are parallel inputted to the respective groups at the same time. Note that the number of groups at this point is called a division number. For example, if the latch circuits are grouped into 4 stages each, then it is called a 4-branch division drive.

The time necessary to complete writing of the digital signals into all the latch stages of the latch (A) 120b is called a line period. In other words, the line period is defined as a time interval from the start of writing the digital data signals into the latch circuit of the leftmost stage to the end of writing the digital signals into the latch of the rightmost stage in the latch (A) 120*b*. In effect, the above-defined line period added with the horizontal retrace period may also be referred to as the line period.

After the completion of one line period, a latch signal is supplied to the latch (B) 120*c*. In this moment, the digital signals written in and held by the latch (A) 120*b* are sent all at once to the latch (B) 120*c* to be written in and held by all the latch stages thereof.

Sequential writing-in of digital signals on the basis of the timing signals from the shift register 120*a* is again carried out to the latch (A) 120*b* after it has completed sending the digital signals to the latch (B) 120*c*.

During this second time one line period, the digital signals written in and held by the latch (B) 120*c* are inputted to the source signal lines S1 to Sx.

On the other hand, the gate signal line driving circuit 122 is composed of a shift register and a buffer (both not shown in the figure). Depending on the situation, the gate signal line driving circuit 122 may have a level shifter in addition to the shift register and the buffer.

In the gate signal line driving circuit 122, the gate signal is supplied to the buffer (not shown in the figure) from the shift register (also not shown in the figure), and this is supplied to a corresponding gate signal line. Gate electrodes of the switching TFTs 104 of one line portion of pixels are connected to each of the gate signal lines G1 to Gy. All of the switching TFTs 104 of the one line portion of pixels must be placed in an ON state simultaneously, and therefore a buffer in which a large electric current can flow is used.

Note that the number of source signal line driving circuits and gate signal line driving circuits, their structure, and their operation are not limited to the structure shown by Embodiment 1. The area sensor of the present invention is capable of using a known source signal line driving circuit and a known gate signal line driving circuit.

Figure 6:
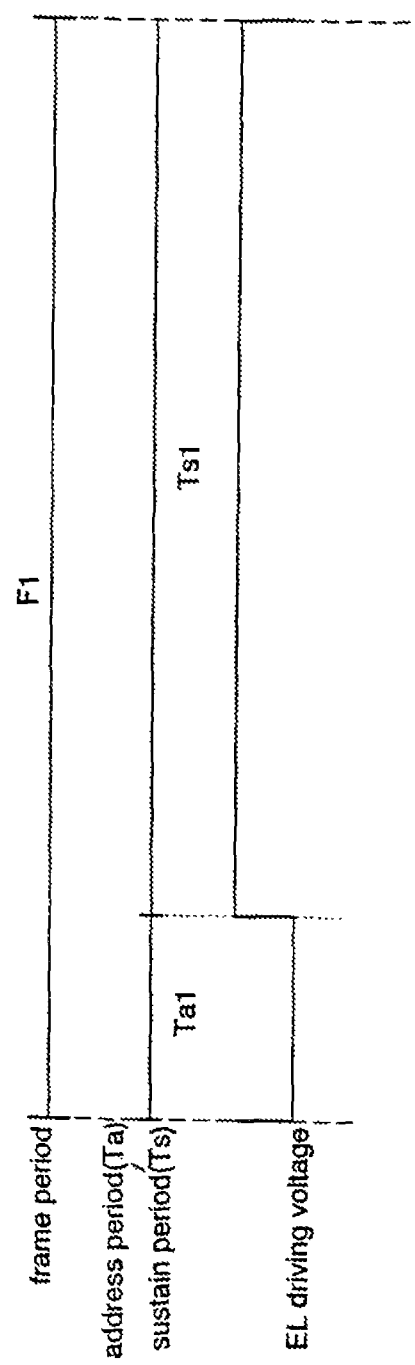
FIG. 6 is a timing chart of light emission of an EL element when an image is read.

Next, a timing chart for a case of driving the switching TFT 104 and the EL driving TFT 105 of the sensor portion by a digital method is shown in FIG. 6.

A period through which all of the pixels of the sensor portion 101 emit light is referred to as one frame period F. The frame period is divided into an address period Ta and a sustain period Ts. The address period is a period in which a digital signal is inputted to all of the pixels during one frame period. The sustain period (also referred to as a turn-on period) denotes a period in which the EL elements emit light or not in accordance with the digital signal inputted to the pixels in the address period and display is performed.

The electric potential of the electric power source supply lines V1 to Vx is maintained at a predetermined electric potential (electric power source potential).

First, in the address period Ta, the electric potential of the opposing electrode of the EL element 106 is maintained at the same height as the electric power source potential.

Then all of the switching TFTs 104 connected to the gate signal line G1 turn on in accordance with a gate signal inputted to the gate signal line G1. A digital signal is next inputted from the source signal line driving circuit 120 to the source signal lines S1 to Sx. The digital signal inputted to the source signal lines S1 to Sx is inputted to the gate electrodes of the EL driving TFTs 105 through the switching TFTs 104 which are in an ON state.

Next, all of the switching TFTs 104 connected to the gate signal line G2 are placed in an ON state in accordance with a gate signal inputted to the gate signal line G2. The digital signal is then inputted from the source signal line driving circuit 120 to the source signal lines S1 to Sx. The digital signal inputted to the source signal lines S1 to Sx is inputted to the gate electrodes of the EL driving TFTs 105 through the switching TFTs 104 which are in an ON state.

The above operations are repeated through the gate signal line Gy, the digital signal is inputted to the gate electrodes of the EL driving TFTs 105 of all the pixels 102, and the address period is completed.

The sustain period begins simultaneously to the end of the address period Ta. All of the switching TFTs 104 are placed in an OFF state in the sustain period.

Then, at the same time as the sustain period begins, the electric potential of the opposing electrodes of all the EL elements has a height of the electric potential difference between the electric power source potential to the level at which the EL elements will emit light when the electric potential of the electric power source is applied to the pixel electrodes. Note that the electric potential difference between the pixel electrode and the opposing electrode is referred to as an EL driving voltage in this specification. Further, the EL driving TFTs 105 are placed in an ON state in accordance with the digital signal inputted to the gate electrode of the EL driving TFTs 105 of each pixel. Therefore, the electric power source potential is applied to the pixel electrodes of the EL elements, and the EL elements of all pixels emit light.

One frame period is completed at the same time as the sustain period is completed. It is necessary that the pixels emit light in all of the sampling periods ST1 to STy with the present invention. Therefore, it is very important that the sensor frame period SF be included within the sustain period when using the digital driving method of Embodiment 1.

Note that an explanation of a method of driving the area sensor for reading in a single color image is explained in Embodiment 1, but a case of reading in a color image is similar. However, for the case of an area sensor which reads in a color image, one frame period is divided into three subframe periods corresponding to RGB, and an address period and a sustain period are formed in each subframe period. A digital signal is inputted to all of the pixels such that only the EL elements of pixels corresponding to R will emit light, and only the EL elements for the color R perform light emission in the sustain period. The subframe periods for G and B are similar, and only EL elements of pixels corresponding to the respective colors perform light emission in each sustain period.

For the case of an area sensor which reads in a color image, it is important that each sustain period of the three subframe periods corresponding to RGB contains a sensor frame period for R, G, and B (SFr, SFg, SFb), respectively.

Embodiment 2

A method of driving the switching TFT 104 and the EL driving TFT 105 when displaying an image in the sensor portion 101 is explained in Embodiment 2. Note that the structure of the sensor portion is the same as the structure shown by the embodiment mode, and therefore FIG. 1 and FIG. 2 may be referenced.

Figure 7:
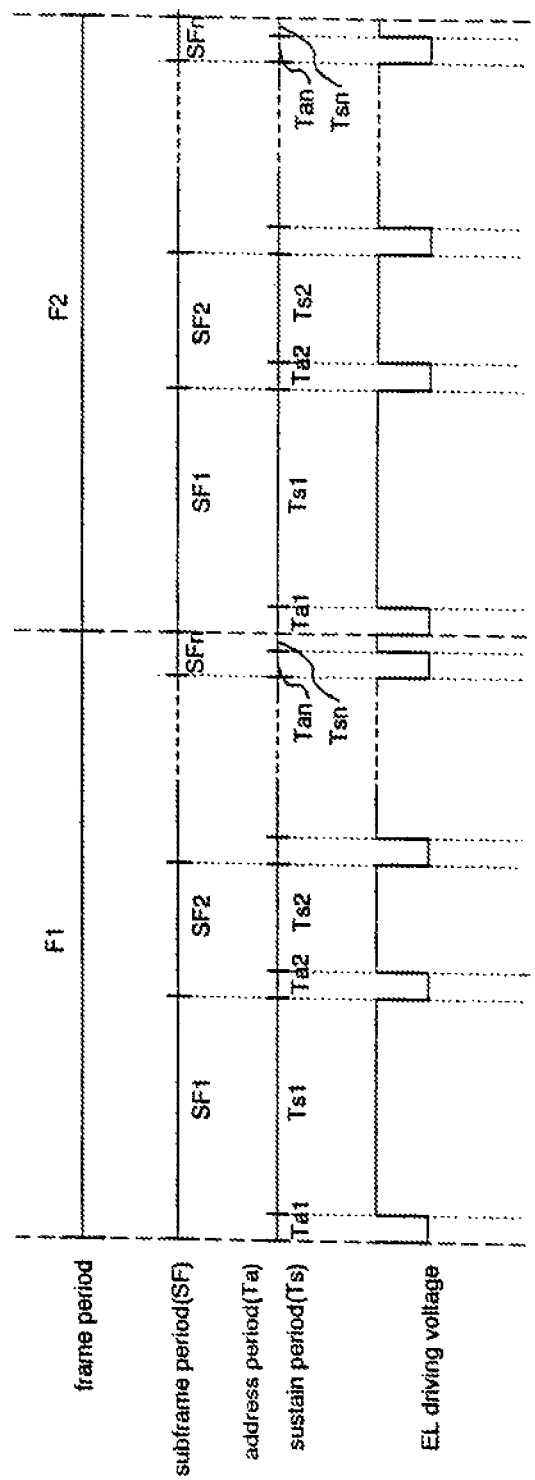
FIG. 7 is a timing chart of light emission of an EL element when an image is displayed.

A timing chart when performing display of an image in the sensor portion 101 in the area sensor of the present invention by a digital method is shown in FIG. 7.

First, one frame period F is divided into N subframe periods SF1 to SFN. The number of subframe periods in one frame period also increases as the number of gray scales increases. Note that, when the sensor portion of the area sensor displays an image, one frame period F denotes a period during which all pixels of the sensor portion display one image.

It is preferable that 60 or more frame periods be provided each second for the case of Embodiment 2. By setting the number of images displayed each second to 60 or greater, it becomes possible to visually suppress image flicker.

The subframe period is divided into an address period Ta and a sustain period Ts. The address period is a period within one subframe period during which a digital video signal is inputted to all pixels. Note that the digital video signal is a digital signal having image information. The sustain period (also referred to as a turn-on period) denotes a period during which EL elements are placed in a state of emitting light or not emitting light in accordance with the digital video signal inputted to the pixels in the address period and display is performed. Note that the digital video signal denotes the digital signal having image information.

The address periods Ta of SF1 to SFN are taken as address periods Ta1 to TaN, and the sustain periods Ts of SF1 to SFN are taken as sustain periods Ts1 to TsN.

The electric potential of the electric power source supply lines V1 to Vx is maintained at a predetermined electric potential (electric power source potential).

First, the electric potential of the opposing electrode of the EL elements 106 is maintained at the same height as the electric power source potential in the address period Ta.

Next, all of the switching TFTs 104 connected to the gate signal line G1 are placed in an ON state in accordance with a gate signal inputted to the gate signal line G1. The digital video signal is then inputted to the source signal lines S1 to Sx from the source signal line driving circuit 102. The digital video signal has "0" or "1" information, and one of the "0" and "1" digital video signals is a signal having a "HI" voltage, while the other is a signal having a "LO" voltage.

The digital video signal inputted to the source signal lines S1 to Sx is then inputted to the gate electrodes of the EL driving TFTs 105 through the switching TFTs 104 in an ON state.

All of the switching TFTs 104 connected to the gate signal line G1 are then placed in an OFF state, and all of the switching TFTs 104 connected to the gate signal line G2 are placed in an ON state in accordance with a gate signal inputted to the gate signal line G2. The digital video signal is then inputted to the source signal lines S1 to Sx from the source signal line driving circuit 102. The digital video signal inputted to the source signal lines S1 to Sx is inputted to the gate electrodes of the EL driving TFTs 105 through the switching TFTs 104 in an ON state.

The above operations are repeated through the gate signal line Gy, and the digital video signal is inputted to the gate electrodes of the EL driving TFTs 105 of all the pixels 102, and the address period is completed.

The sustain period Ts begins simultaneously with the completion of the address period Ta. All of the switching TFTs 104 are in an OFF state in the sustain period. The electric potential of the opposing electrodes of all the EL elements has a height of the electric potential difference between the electric power source potential to the level at which the EL elements will emit light when the electric potential of the electric power source is applied to the pixel electrodes.

When the digital video signal has "0" information, the EL driving TFT 105 is placed in an OFF state in Embodiment 2. The pixel electrode of the EL elements is therefore maintained at the electric potential of the opposing electrode. As a result, the EL element 106 does not emit light when the digital video signal having "0" information is inputted to the pixel.

On the other hand, when the digital video signal has "1" information, the EL driving TFTs 105 are placed in an ON state. The electric power source potential is therefore applied to the pixel electrode of the EL element 106. As a result, the EL element 106 of the pixel into which the digital video signal having "1" information is inputted emits light.

The EL elements are thus placed in a state in which they emit light or do not emit light in accordance with the information of the digital video signal input to the pixels, and the pixels perform display.

One subframe period is complete at the same time as the sustain period is complete. The next subframe period then appears, and once again the address period begins. The sustain period again beings after the digital video signal is input to all of the pixels. Note that the order of appearance of the subframe periods SF1 to SFn is arbitrary.

Similar operations are then repeated in the remaining subframe periods, and display is performed. After completing all of the a subframe periods, one image is displayed, and one frame period is completed. When one frame period is complete, the subframe period of the next frame period appears, and the above stated operations are repeated.

The lengths of the address periods Ta1 to Tan of the respective n subframe periods are each the same in the present invention. Further, the ratio of lengths of the n sustain periods Ts1, . . . , Tsn is expressed as Ts1: Ts2: Ts3: . . . : Ts(n-1): Tsn=$2^0$: $2^{-1}$: $2^2$: . . . : $2^{-(n-2)}$: $2^{-(n-1)}$.

The gray-scale of each pixel is determined in accordance with during which subframe periods in one frame period the pixel is made to emit light. For example, when n=8, and taking the brightness of pixels which emit light in all of the sustain periods as having a value of 100%, pixels which emit light in Ts1 and Ts2 can express a brightness of 75%, and for a case of selecting Ts3, Ts5, and Ts8, a brightness of 16% can be expressed.

Note that it is possible to freely combine Embodiment 2 with Embodiment 1.

Embodiment 3

The electric potential of the opposing electrodes are maintained at the same electric potential as that of the electric power source potential during the address period in Embodiments 1 and 2. Therefore, the EL elements do not emit light. However, the present invention is not limited to this structure. If an electric potential difference is always formed between the opposing electric potential and the electric power source potential, on an order at which the EL elements will emit light, when the electric power source potential is applied to the pixel electrodes, display may also be performed in the address period, similar to the display period.

However, when combining Embodiment 1, in which the EL elements are used as the light source of the area sensor, with Embodiment 3, it is important that the sensor frame period SF be contained within the frame period for an area sensor which reads in a single color image. Furthermore, it is important that the three subframe periods corresponding to RGB be contained in R, G, and B sensor frame periods, respectively, for an area sensor which reads in a color image.

In addition, when combining Embodiment 2, in which an image is displayed in the sensor portion, with Embodiment 3, the entire subframe period in practice becomes a period for performing display, and therefore the lengths of the subframe periods are set so as to be SF1: SF2: SF3: . . . : SF(n-1): SFn=$2^0$: $2^{-1}$: $2^{-2}$: . . . : $2^{-(n-2)}$: $2^{-(n-1)}$. An image having a high brightness can be obtained in accordance with the above structure when compared with the drive method in which light is not emitted during the address period.

Embodiment 4

An example of a method of driving the switching TFTs 104 and the EL driving TFTs 105, which control the operation of the EL elements 106 shown in FIG. 2, by a method which differs from that of Embodiment 1 is explained in Embodiment 4. Note that the structure of the sensor portion is the same as that shown by the embodiment mode, and therefore FIG. 1 and FIG. 2 may be referenced.

Figure 8:
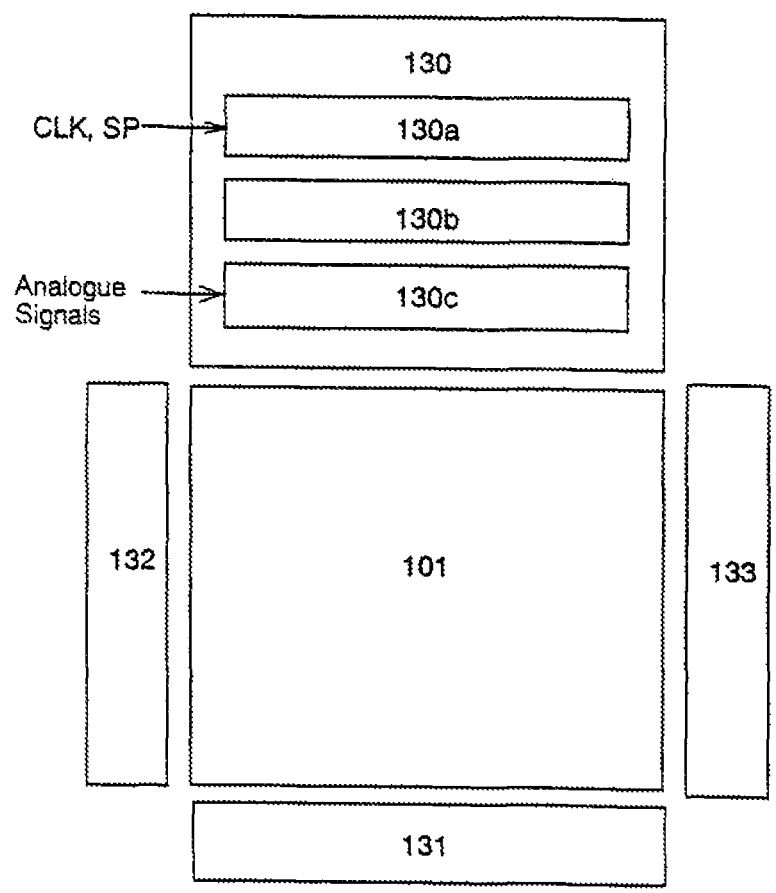
FIG. 8 is a top view of an area sensor for analog driving.

A top view of an area sensor of Embodiment 4 is shown in FIG. 8. Reference numeral 130 denotes a source signal line driving circuit, reference numeral 132 denotes a gate signal line driving circuit, and both control the driving of the switching TFT 104 and the EL driving TFT 105. Further, reference numeral 131 denotes a sensor source signal line driving circuit, and reference numeral 133 denotes a sensor gate signal line driving circuit, and both control the driving of the reset TFT 110, the buffer TFT 111, and the selection TFT 112. One each of the source signal line driving circuit and the gate signal line driving circuit are formed in Embodiment 4, but the present invention is not limited to this structure. Two source signal line driving circuits may also be formed. Further, two gate signal line driving circuits may also be formed.

Note that the source signal line driving circuit 130, the gate signal line driving circuit 132, the sensor source signal line driving circuit 131, and the sensor gate signal line driving circuit 133 are referred to as a driving portion throughout this specification.

The source signal line driving circuit 130 has a shift register 130a, a level shifter 130b, and a sampling circuit 130c. Note that the level shifter may be used when necessary, and it need not necessarily be used. Further, a structure is used in Embodiment 4 in which the level shifter is formed between the shift register 130a and the sampling circuit 130c, but the present invention is not limited to this structure. A structure in which the level shifter 130b is incorporated within the shift register 130a may also be used.

A clock signal CLK and a start pulse signal SP are input to the shift register 130a in the source signal line driving circuit 130. A sampling signal is output from the shift register 130a in order to sample an analog signal. The output sampling signal is input to the level shifter 130b, and it electric potential amplitude is increased, and it is output.

The sampling signal output from the level shifter 130b is input to the sampling circuit 130c. The analog signal input to the sampling circuit 130c is then sampled by the sampling signal, and input to source signal lines S1 to Sx.

On the other hand, the gate signal line driving circuit 132 has a shift register and a buffer (neither shown in the figure). Further, the gate signal line driving circuit 132 may also have a level shifter in addition to the shift register and the buffer, depending upon the circumstances.

In the gate signal line driving circuit 132, a gate signal is supplied to the buffer (not shown in the figure) from the shift register (also not shown in the figure), and this is supplied to a corresponding gate signal line. Gate electrodes of the switching TFTs 104 of one line portion of pixels are connected to the gate signal lines G1 to Gy, and all of the switching TFTs 104 of the one line portion of pixels must be placed in an ON state simultaneously, and therefore a buffer in which a large electric current is capable of flowing is used.

Note that the number of source signal line driving circuits and gate signal line driving circuits, their structure, and their operation are not limited to the structure shown by Embodiment 4. The area sensor of the present invention is capable of using a known source signal line driving circuit and a known gate signal line driving circuit.

Figure 9:
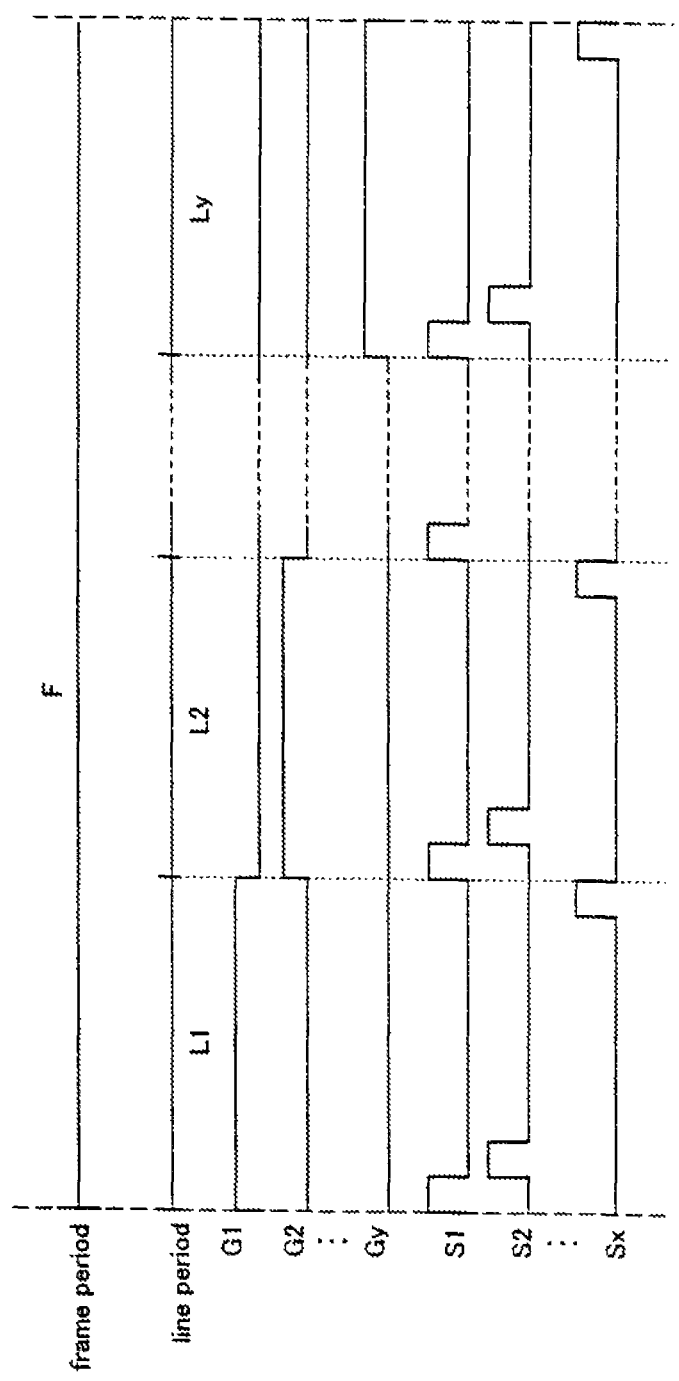
FIG. 9 is a timing chart of light emission of an EL element when an image is read.

Next, a timing chart for a case of driving the switching TFT 104 and the EL driving TFT 105 of the sensor portion by an analog method is shown in FIG. 9. A period through which all of the pixels of the sensor portion display light is referred to as one frame period F. One line period L denotes a period from the selection of one gate signal line until the selection of the next, separate, gate signal line. For the case of the area sensor shown in FIG. 2, there are y gate signal lines, and therefore y line periods L1 to Ly are formed within one frame period.

The number of line periods within one frame period increases along with increasing resolution, and the driving circuits must be driven at a high frequency.

First, the electric potential of the electric power source supply lines V1 to Vx is maintained at the constant electric power source potential. The opposing electric potential, the electric potential of the opposing electrodes of the EL elements 106, is also maintained at a constant electric potential. The electric power source potential has an electric potential difference with the opposing electric potential on the order that the EL elements 106 will emit light when the electric power supply potential is applied to the pixel electrodes of the EL elements 106.

In the first line period L1, all of the switching TFTs 104 connected to the gate signal line G1 are placed in an ON state in accordance with a gate signal input to the gate signal line G1 from the gate signal line driving circuit 132. The analog signal is then input to the source signal lines S1 to Sx in order from the source signal line driving circuit 130. The analog signal input to the source signal lines S1 to Sx is input to the gate electrodes of the EL driving TFTs 105 through the switching TFTs 104 which are in an ON state.

The size of the electric current flowing in a channel forming region of the EL driving TFTs 105 is controlled by the height of the electric potential (voltage) of the signal input to the gate electrodes of the EL driving TFTs 105. Therefore, the electric potential applied to the pixel electrodes of the EL elements 106 is determined by the height of the electric potential of the analog signal input to the gate electrodes of the EL driving TFTs 105. The EL elements 105 are controlled by the electric potential of the analog signal, and perform the emission of light. Note that, in the case of Embodiment 4, the analog signal input to all of the pixels is maintained at an electric potential having the same height.

The first line period L1 is complete when input of the analog signal to the source signal lines S1 to Sx is completed. Note that the period until the input of the analog signal to the source signal lines S1 to Sx is complete may also be combined with a horizontal return period and taken as one line period. The second line period L2 begins next, and all of the switching TFTs 104 connected to the gate signal line G1 are placed in an OFF state. All of the switching TFTs 104 connected to the gate signal line G2 are then placed in an ON state in accordance with a gate signal input to the gate signal line G2. Then, similar to the first line period L1, the analog signal is input in order to the source signal lines S1 to Sx.

The above operations are repeated up through the gate signal line Gy, and all of the line periods L1 to Ly are complete. When all of the line periods L1 to Ly are completed, one frame period is complete. The EL elements of all of the pixels perform light emission by completing one frame period. Note that all of the line periods L1 to Ly and a vertical return period may also be combined and taken as one frame period.

It is necessary for the pixels to emit light in all of the sampling periods ST1 to STy with the present invention, and for the case of the driving method of Embodiment 4, it is important that the sensor frame period SF is included within the frame period.

Note that an explanation of a method of driving an area sensor for reading in a single color image is explained in Embodiment 4, but a case of reading in a color image is similar. However, for an area sensor which reads in a color image, one frame period is divided into three subframe periods corresponding to RGB. An analog signal is then input to all of the pixels such that only the EL elements of pixels corresponding to R will emit light in an R subframe period, and only the EL elements for the color R perform light emission. The subframe periods for G and B are similar, and only EL elements of pixels corresponding to the respective color perform light emission.

For the case of an area sensor which reads in a color image, it is important that each sustain period of the three subframe periods corresponding to RGB contain a sensor frame period for R, G, and B (SFr, SFg, SFb), respectively.

Note that if an analog video signal having image information is substituted for the analog signal for a case of displaying an image in the sensor portion 101 in the driving method of Embodiment 4, display of the image in the sensor portion 101 becomes possible.

Embodiment 5

A cross sectional diagram of an area sensor of the present invention is explained in Embodiment 5.

Figure 14A:
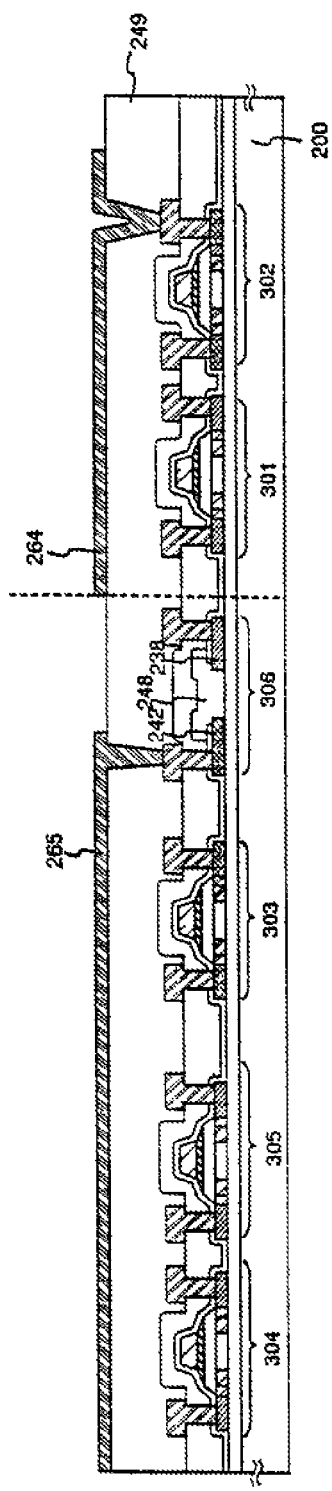
FIGS. 14A and 14B show the steps of producing the sensor portion.
Figure 14B:
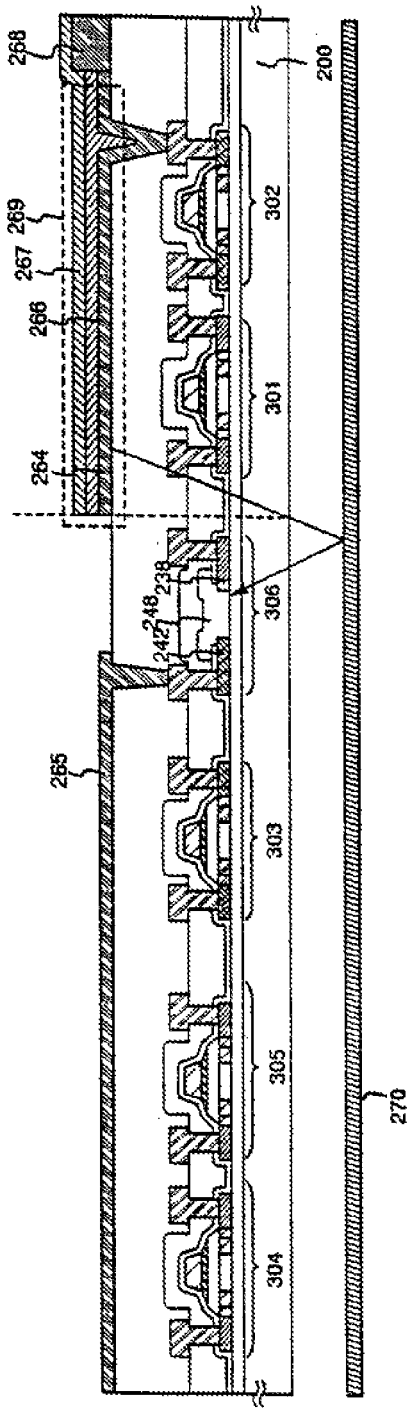

FIG. 14B shows a cross sectional diagram of an area sensor of Embodiment 5. Reference numeral 301 denotes a switching TFT, reference numeral 302 denotes an EL driving TFT, 303 denotes a reset TFT, 304 denotes a buffer TFT, and reference numeral 305 denotes a selection TFT.

Further, reference numeral 242 denotes a p-type semiconductor layer, 248 denotes a photoelectric conversion layer, and reference numeral 238 denotes a n-type semiconductor layer. A photodiode 306 is formed by the p-type semiconductor layer 242, the photoelectric conversion layer 248, and the n-type semiconductor layer 238. Reference numeral 265 denotes a sensor wiring, and the sensor wiring is connected the n-type semiconductor layer 238 and an external electric power source. Further, the p-type semiconductor layer 242 of the photodiode 306 and the drain region of the reset TFT 303 is connected each other electrically.

Further, reference numeral 264 denotes a pixel electrode (anode), 266 denotes an EL layer and 267 denotes an opposing electrode (cathode). An EL element 269 is formed by the pixel electrode (anode) 264, the EL layer 266 and the opposing electrode (cathode) 267. Note that reference numeral 268 denotes a bank, and that the EL layers 266 of adjacent pixels are separated.

Reference numeral 270 denotes a subject, and light emitted from the EL element 269 is reflected by the subject 270 and is irradiated to the photodiode 306. The subject 270 is formed on the side of a sensor substrate 200 on which the TFTs are not formed in Embodiment 5.

The switching TFT 301, the buffer TFT 304, and the selection TFT 305 are all n-channel TFTs in Embodiment 5. Further, the EL driving TFT 302 and the reset TFT 303 are a p-channel TFT. Note that the present invention is not limited to this structure. Therefore, the switching TFT 301, the EL driving TFT 302, the buffer TFT 304, the selection TFT 305, and the reset TFT 303 may be either n-channel TFTs or p-channel TFTs.

However, when a source region or a drain region of the EL driving TFT 302 is electrically connected to the anode 264 of the EL element 269, as in Embodiment 5, it is preferable that the EL driving TFT 302 be a p-channel TFT. Conversely, when the source region or the drain region of the EL driving TFT 302 is electrically connected to the cathode of the EL element 269, it is preferable that the EL driving TFT 302 be a n-channel TFT.

Note the photodiode and the other TFTs of Embodiment 5 can be formed at the same time, and therefore the number of process steps can be suppressed.

Note that it is possible to freely combine Embodiment 5 with Embodiments 1 to 4.

Embodiment 6

A cross sectional diagram of an area sensor of the present invention, differing from that of Embodiment 5, is explained in Embodiment 6.

Figure 15:
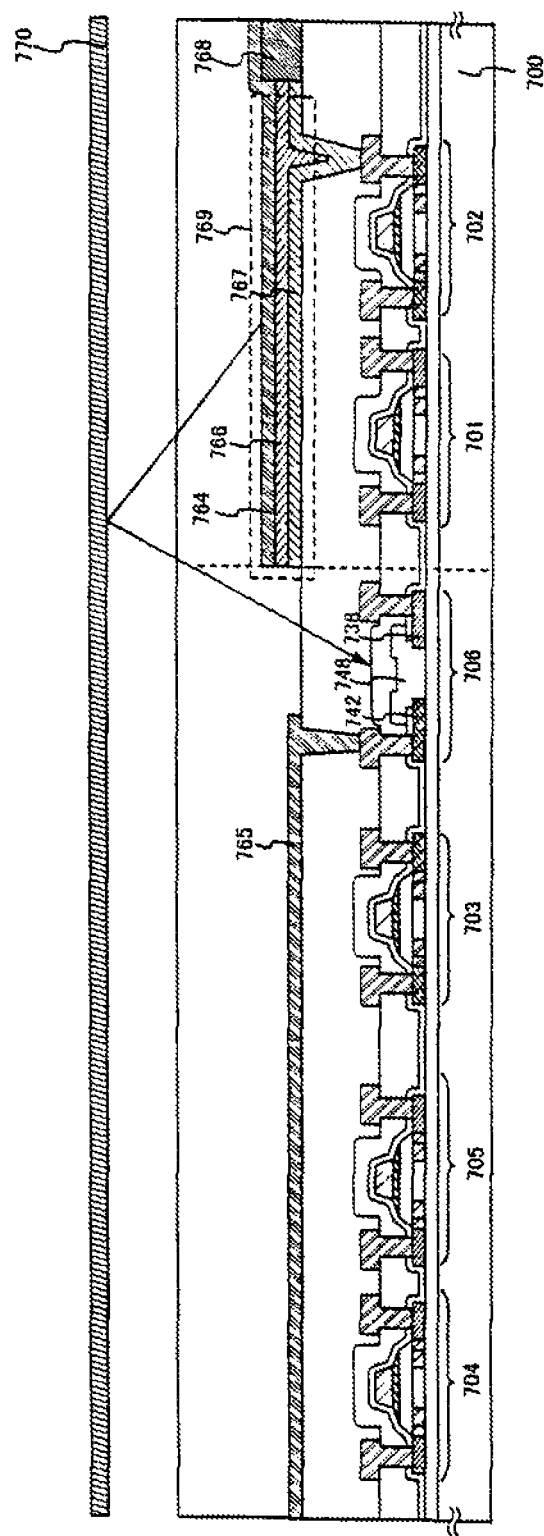
FIG. 15 is an enlarged view of a photodiode according to the present invention.

FIG. 15 shows a cross sectional diagram of an area sensor of Embodiment 6. Reference numeral 701 denotes a switching TFT, reference numeral 702 denotes an EL driving TFT, 703 denotes a reset TFT, 704 denotes a buffer TFT, and reference numeral 705 denotes a selection TFT.

Further, reference numeral 738 denotes a n-type semiconductor layer, 748 denotes a photoelectric conversion layer, and reference numeral 742 denotes a p-type semiconductor layer. A photodiode 706 is formed by the n-type semiconductor layer 738, the photoelectric conversion layer 748, and the p-type semiconductor layer 742. Reference numeral 765 denotes a sensor wiring, and the sensor wiring electrically connects the p-type semiconductor layer 742 and an external electric power source. Further, the n-type semiconductor layer 738 of the photodiode 706 and a drain region of the reset TFT 703 are electrically connected.

Reference numeral 767 denotes a pixel electrode (cathode), 766 denotes an EL layer, and 764 denotes an opposing electrode (anode). An EL element 769 is formed by the pixel electrode (cathode) 767, the EL layer 766, and the opposing electrode (anode) 764. Note that reference numeral 768 denotes a bank, and that the EL layers 766 of adjacent pixels are separated.

Reference numeral 770 denotes a subject, and light emitted from the EL element 769 is reflected by the subject 770 and is irradiated to the photodiode 706. Differing from Embodiment 5, the subject 770 is formed on the side of a substrate 700 on which the TFTs are formed in Embodiment 6.

The switching TFT 701, the EL driving TFT 702, and the reset TFT 703 are all n-channel TFTs in Embodiment 6. Further, the buffer TFT and the selection TFT are p-channel TFTs. Note that the present invention is not limited to this structure. Therefore, the switching TFT 701, the EL driving TFT 702, the buffer TFT 704, the selection TFT 705, and the reset TFT 703 may be either n-channel TFTs or p-channel TFTs.

However, when a source region or a drain region of the EL driving TFT 702 is electrically connected to the cathode 709 of the EL element 769, as in Embodiment 6, it is preferable that the EL driving TFT 702 be a n-channel TFT. Conversely, when the source region or the drain region of the EL driving TFT 702 is electrically connected to the anode 712 of the EL element 769, it is preferable that the EL driving TFT 702 be a p-channel TFT.

Furthermore, when the drain region of the reset TFT 703 is electrically connected to the p-type semiconductor layer 742 of the photodiode 706, as in Embodiment 6, it is preferable that the reset TFT 703 be a n-channel TFT, and that the buffer TFT 704 be a p-channel TFT. Conversely, when the drain region of the reset TFT 703 is electrically connected to the p-type semiconductor layer 742 of the photodiode 702, and the sensor wiring 765 is connected to the n-type semiconductor layer 738, it is preferable that the reset TFT 703 be a p-channel TFT, and that the buffer TFT 704 be a n-channel TFT.

Note the photodiode 706 and the other TFTs of Embodiment 6 can be formed at the same time, and therefore the number of process steps can be suppressed.

Note also that it is possible to freely combine Embodiment 6 with Embodiments 1 to 5.

Embodiment 7

A method of producing a sensor portion of an area sensor of the present invention will be described with reference to FIGS. 10A to 14B. The sensor portion has switching TFTs 301, EL driving TFTs 302, reset TFTs 303, buffer TFTs 304, selective TFTs 305, and diodes 306 on the same substrate.

First, referring to FIG. 10A, a substrate 200 made of glass such as barium bolosilicate glass and aluminobolosilicate glass (e.g., #7059 glass and #1737 glass produced by Corning) is used in this embodiment. The substrate 200 is not particularly limited as long as it has light transparency. A quartz substrate, a glass substrate, a ceramic substrate, or the like may be used. Furthermore, a plastic substrate may be used, which has heat resistance that can withstand a treatment temperature in this embodiment.

As the substrate 200, a stainless substrate may be used. However, since a stainless substrate is not transparent, it is effective only when an EL element 769 emits light upward as shown in FIG. 15.

An insulating film (underlying film) made of silicon oxide is formed on the substrate 200 so as to cover it. The insulating film can be made of a silicon oxide film, a silicon nitride film, or a silicon oxide nitride film. For example, a silicon oxide nitride film made of $SiH_4$, $NH_3$, and $N_2O$ may be formed to a thickness of 250 to 800 nm (preferably, 300 to 500 nm) by plasma CVD. Similarly, a hydrogenated silicon oxide nitride film made of $SiH_4$ and $N_2O$ may be formed to a thickness of 250 to 800 nm (preferably, 300 to 500 nm). In this embodiment, an insulating film made of silicon oxide is formed to a thickness of 250 to 800 nm so as to have a single-layer configuration. A material for the insulating film is not limited to silicon oxide.

Next, a flattening insulating film 201 is formed by polishing the insulating film by a CMP method. The CMP method is conducted by a known method. In polishing an oxide film, slurry of a solid-liquid dispersion system is generally used, in which an abrasive of 100 to 1000 nmφ is dispersed in an aqueous solution containing a reagent such as a pH regulator. In this embodiment, silica slurry (pH=10 to 11) is used, in which 20% by weight of fumed silica particles obtained by thermally dissolving silicon chloride gas in an aqueous solution with potassium hydroxide added thereto are dispersed.

After the flattening insulating film 201 is formed, semiconductor layers 202 to 208 are formed thereon. The semiconductor layers 202 to 208 are obtained by forming a semiconductor film having an amorphous structure by a known method (e.g., sputtering, LPCVD, plasma CVD, or the like), crystallizing the semiconductor film by known crystallization process (e.g., laser crystallization, thermal crystallization, thermal crystallization using a catalyst such as nickel, or the like) to obtain a crystalline semiconductor film, and patterning the crystalline semiconductor film to a desired shape. The semiconductor layers 202 to 208 are formed to a thickness of 25 to 80 nm (preferably, 30 to 60 nm). Although there is no particular limit to a material for the crystalline semiconductor film, a silicon or silicon germanium ($Si_xGe_{1-x}$) alloy may be preferably used. In this embodiment, an amorphous silicon film of 55 nm is formed by plasma CVD, and thereafter, a solution containing nickel is held onto the amorphous silicon film. After the amorphous silicon film is dehydrogenated at 500° C. for one hour, the film is thermally crystallized at 550° C. for four hours. Furthermore, the amorphous silicon film is subjected to laser annealing for the purpose of enhancing crystallization, whereby a crystalline silicon film is formed. The crystalline silicon film is patterned by photolithography to form the semiconductor layers 202 to 208.

After the semiconductor layers 202 to 208 are formed, they may be doped with a trace amount of an impurity element (boron or phosphorus) so as to control the threshold values of TFTs.

In the case of producing a crystalline semiconductor film by laser crystallization, a pulse-oscillation type or continuous light-emitting type excimer laser, a YAG laser, and a $YVO_4$ layer can be used. In the case of using these lasers, a laser beam emitted from a laser oscillator may be condensed in a line shape by an optical system and radiated to a semiconductor film. Conditions of crystallization are appropriately selected by those skilled in the art. However, in the case of using an excimer laser, a pulse oscillation frequency is set to be several 300 Hz, and a laser energy density is set to be 100 to 400 $mJ/cm^2$ (typically, 200 to 300 $mJ/cm^2$). Furthermore, in the case of using a YAG laser, the second harmonic thereof may be used, with a pulse oscillation frequency set at several 30 to 300 kHz, and a laser energy density set at 300 to 600 $mJ/cm^2$ (typically 350 to 500 $mJ/cm^2$). Then, laser beams condensed in a line shape with a width of 100 to 1000 μm (e.g., 400 μm) may be radiated to the entire surface of a substrate with an overlapped ratio of the line-shaped laser beams set at 50% to 98%.

Then, a gate insulating film 209 covering the semiconductor layers 202 to 208 is formed. The gate insulating film 209 is formed of an insulating film containing silicon with a thickness of 40 to 150 nm by plasma CVD or sputtering. In this embodiment, a silicon oxide nitride film (composition ratio: Si=32%, O=59%, N=7%, H=2%) is formed to a thickness of 110 nm by plasma CVD. Needless to say, the gate insulating film is not limited to a silicon oxide nitride film. Another insulating film containing silicon may be used as a single-layer or multi-layer configuration.

In the case of using a silicon oxide film as the insulating film, the insulating film can be formed by mixing tetraethyl orthosilicate (TEOS) and $O_2$ by plasma CVD, setting a reaction pressure at 40 Pa and a substrate temperature at 300° C. to 400° C., and allowing discharge to occur at a high-frequency (13.56 MHz) power density of 0.5 to 0.8 $W/cm^2$. The silicon oxide film thus produced is subjected to thermal annealing at 400° C. to 500° C., thereby exhibiting satisfactory characteristics as the gate insulating film.

Then, as shown in FIG. 10A, a first conductive film 210a (thickness: 20 to 100 nm) and a second conductive film 210b (thickness: 100 to 400 nm) are stacked on the gate insulating film 209. In this embodiment, the first conductive film 210a made of a TaN film with a thickness of 30 nm and the second conductive film 210b made of a W film with a thickness of 370 nm are stacked. The TaN film is formed by sputtering using Ta as a target in a nitrogen atmosphere. The W film is formed by sputtering using W as a target. The W film can also be formed by thermal CVD, using tungsten hexafluoride ($WF_6$). In any case, the W film needs to have a low resistance so as to be used as a gate electrode, and the resistance of the W film is desirably 20 µΩcm or less. By enlarging crystal particles, the W film is allowed to have a low resistance. However, in the case where a number of impurity elements such as oxygen are present in the W film, crystallization of the W film is inhibited to have a high resistance. Thus, in this embodiment, the W film is formed by sputtering using W with a high purity (99.9999%) as a target in such a manner that impurities are not mixed from a vapor phase during film formation, whereby the resistance of 9 to 20 µΩcm of the W film can be realized.

In this embodiment, although the first conductive film 210a is made of TaN, and the second conductive film 210b is made of W, there is no particular limit to the materials. The first and second conductive films 210a and 210b may be made of an element selected from Ta, W, Ti, Mo, Al, Cu, Cr, and Nd, or an alloy material or a compound material containing the element as a main component. Furthermore, a semiconductor film such as a polycrystalline silicon film doped with an impurity element such as phosphorus may be used. An AgPdCu alloy may also be used. Furthermore, it may be possible that the first conductive film is made of a tantalum (Ta) film, and the second conductive film is made of a W film. It may also be possible that the first conductive film is made of a titanium nitride (TiN) film, and the second conductive film is made of a W film. It may also be possible that the first conductive film is made of tantalum nitride (TaN) film, and the second conductive film is made of an Al film. It may also be possible that the first conductive film is made of a tantalum nitride (TaN) film, and the second conductive film is made of a Cu film.

Next, a mask 211 made of a resist is formed by photolithography, and first etching process for forming electrodes and wiring is conducted (FIG. 10B). The first etching process is conducted under first and second etching conditions. In this embodiment, under the first etching condition, an inductively coupled plasma (ICP) etching method is used, $CF_4$, $Cl_2$, and $O_2$ are used as etching gas, a gas flow ratio thereof is set at 25/25/10 (sccm), and a coil-shaped electrode is supplied with an RF (13.56 MHz) power of 500 W under a pressure of 1 Pa to generate plasma, whereby etching is conducted. The substrate side (sample stage) is also supplied with an RF (13.56 MHz) power of 150 W, whereby a substantially negative self-bias voltage is applied. The W film is etched under the first etching condition, thereby forming tapered portions in a first conductive layer. An etching speed with respect to W under the first etching condition is 200.39 nm/min, and an etching speed with respect to TaN is 80.32 nm/min, and a selection ratio of W with respect to TaN is about 2.5. Furthermore, the taper angle of W becomes about 26° under the first etching condition.

In the first etching process, by forming the mask 211 made of a resist in an appropriate shape, the ends of the first conductive layer and the second conductive layer are tapered due to the effect of the bias voltage applied to the substrate side. The angle of the tapered portion may be 15° to 45°. Thus, first-shaped conductive layers 212 to 216 composed of first conductive layers 212a to 216a and second conductive layers 212b to 216b are formed by the first etching process. Reference numeral 217 denotes a gate insulating film, and regions not covered with the first-shaped conductive layers 212 to 216 are etched by about 20 to 50 nm, whereby thin regions are formed.

Then, second etching process is conducted without removing the mask made of a resist (FIG. 10C). Herein, $CF_4$, $Cl_2$, and $O_2$ are used as etching gas, a gas flow ratio thereof is set at 25/25/10 (sccm), and a coil-shaped electrode is supplied with an RF (13.56 MHz) power of 500 W under a pressure of 1 Pa to generate plasma, whereby etching is conducted. The substrate side (sample stage) is also supplied with an RF (13.56 MHz) power of 20 W, whereby a substantially negative self-bias voltage is applied. An etching speed with respect to W in the second etching process is 124.62 nm/min, and an etching speed with respect to TaN is 20.67 nm/min, and a selection ratio of W with respect to TaN is about 6.05. Thus, the W film is selectively etched. The taper angle of W obtained by second etching becomes about 70°. During the second etching process, second conductive layers 218b to 222b are formed. On the other hand, the first conductive layers 212a to 216a are hardly etched to form first conductive layers 218a to 222a. Reference numeral 223 denotes a gate insulating film, and regions not covered with second-shaped conductive layers 218 to 222 are etched by about 20 to 50 nm, whereby thin regions are formed.

An electrode formed of the first conductive layer 218a and the second conductive layer 218b will become an N-channel type buffer TFT 304 in the late step, and an electrode formed of the first conductive layer 219a and the second conductive layer 219b will become an N-channel type selective TFT 305 in the later step. Similarly, an electrode formed of the first conductive layer 220a and the second conductive layer 220b will become a P-channel type reset TFT 303 in the later step, an electrode formed of the first conductive layer 221a and the second conductive layer 221b will become an N-channel type switching TFT 301 in the later step, and an electrode formed of the first conductive layer 222a and the second conductive layer 222b will become a P-channel type EL driving TFT 302 in the later step.

Figure 11A:
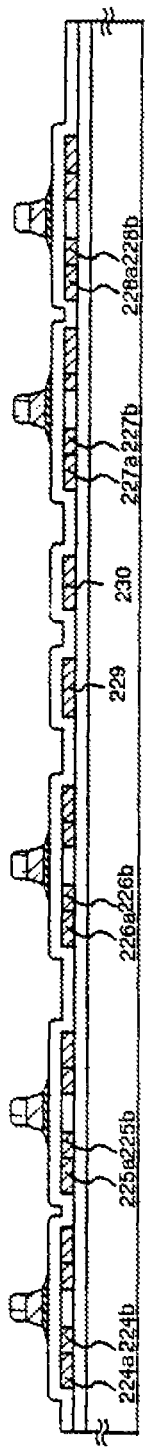
FIGS. 11A to 11C show the steps of producing the sensor portion.

Then, first doping process is conducted to obtain a state in FIG. 11A. Doping is conducted using the second conductive layers 218b to 222b as a mask with respect to an impurity element, in such a manner that the impurity element is added to the semiconductor layers below the taper portions of the first conductive layers 218a to 222a. There is no conductive layer above the semiconductor layers 205 and 206, so that these semiconductor layers are doped from above the gate insulating film 223. In this embodiment, plasma doping is conducted using phosphorus as an impurity element at a dose amount of $3.5 \times 10^{12}$ and an accelerating voltage of 90 keV. Thus, low-concentration impurity regions 224a to 228a, 229, and 230 not overlapped with the first conductive layers, and low-concentration impurity regions 224b to 228b overlapped with the first conductive layers are formed in a self-alignment manner. The concentration of phosphorus added to the low-concentration impurity regions 224b to 228b is $1 \times 10^{17}$ to $1 \times 10^{18}$ atoms/cm$^3$, and has a gentle concentration gradient along the thickness of the taper portions of the first conductive layers 218a to 222a. In the semiconductor layers overlapped with the taper portions of the first conductive layers 218a to 222a, although the impurity concentration is slightly decreased from the ends of the taper portions of the first conductive layers 218a to 222a, the concentration is substantially the same.

A mask 231 made of a resist is formed, and second doping process is conducted, whereby an impurity element providing an N-type to the semiconductor layers is added (FIG.

11B). Doping may be conducted by ion doping or ion implantation. Ion doping is conducted under the conditions of a dose amount of $1\times10^{13}$ to $5\times10^{1}$ atoms/cm$^2$, and an acceleration voltage of 60 to 100 keV. In this embodiment, doping is conducted at a dose amount of $1.5\times10^{15}$ atoms/cm$^2$ and an acceleration voltage of 80 keV. As an impurity element providing an N-type, an element belonging to the Group-XV, typically, phosphorus (P) or arsenic (As) is used. Herein, phosphorus (P) is used. In this case, the conductive layers 218 to 222 function as a mask with respect to the impurity element providing an N-type, whereby high-concentration impurity regions 232a to 236a, 237, and 238, low-concentration impurity regions 232b to 236b not overlapped with the first conductive layers, and low-concentration impurity regions 232c to 236c overlapped with the first conductive layers are formed in a self-alignment manner. The high-concentration impurity regions 232a to 236a, 237, and 238 are supplied with an impurity element providing an N-type in a concentration range of $1\times10^{20}$ to $1\times10^{21}$ atoms/cm$^3$.

Figure 11B:
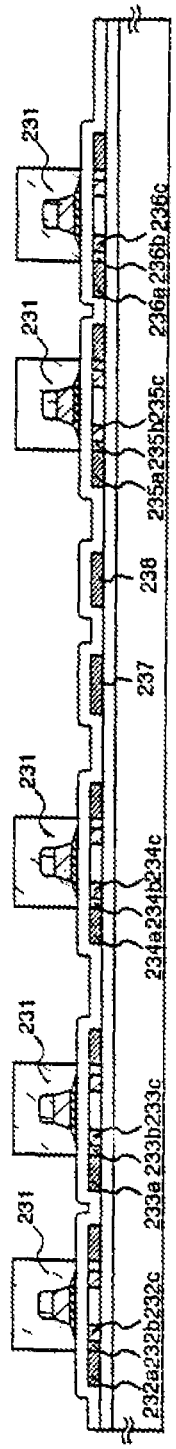

It is not required that the semiconductor films to be a P-channel type are doped with an N-type impurity in the second doping process shown in FIG. 11B. Therefore, the mask 231 may be formed so as to completely cover the semiconductor layers 204, 206, and 208, thereby preventing the semiconductor layers 204, 206, and 208 from being doped with an N-type impurity. Alternatively, the mask 231 is not provided above the semiconductor layers 204, 206 and 208, and the polarity thereof may be reversed in third doping process.

Figure 11C:
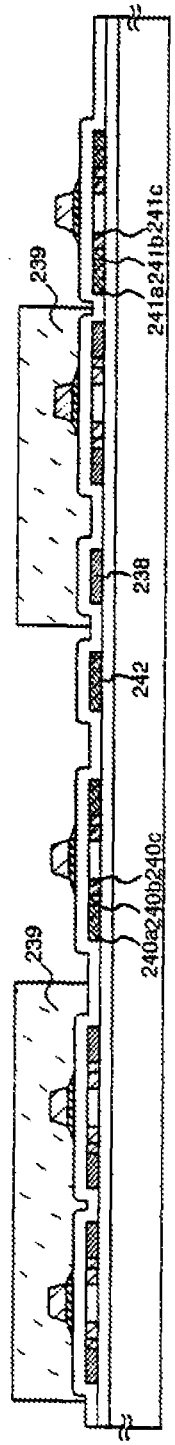

Then, the mask 231 made of a resist is removed, and a mask 239 made of a resist is newly formed to conduct third doping process. Because of the third doping process, impurity regions 240a to 240c, 241a to 241c, and 242 are formed, in which an impurity element providing a conductivity (P-type) opposite to the above-mentioned conductivity (N-type) is added to the semiconductor layers to be active layers of P-channel type TFTs (FIG. 11C). The first conductive layers 220b and 222b are used as a mask with respect to an impurity element, and an impurity element providing a P-type is added to form impurity regions in a self-alignment manner. There of no conductive layer above the impurity region 242, so that the impurity region 242 is doped from above the gate insulating film 223. In this embodiment, the impurity regions 240a to 240c, 241a to 241c, and 242 are formed by ion doping using diborane (B$_2$H$_6$). During the third doping process, the semiconductor layers to form N-channel type TFTs are covered with the mask 239 made of a resist. During the first and second doping process, the impurity regions 240a, 240b, and 240c are supplied with phosphorus in different concentrations. However, by conducting doping so that the concentration of the impurity element providing a P-type becomes $2\times10^{20}$ to $2\times10^{21}$ atoms/cm$^3$ in any region, there is no problem for these regions to function as source regions and drain regions of P-channel type TFTs.

Then, the impurity element added to the respective semiconductor layers is activated. Activation is conducted by thermal annealing using an annealing furnace. Thermal annealing may be conducted in a nitrogen atmosphere with an oxygen concentration of 1 ppm or less (preferably, 0.1 ppm or less) at 400° C. to 700° C. (typically, 500° C. to 550° C.). In this embodiment, activation is conducted by heat treatment at 550° C. for four hours. In addition to thermal annealing, laser annealing or rapid thermal annealing (RTA method) can be applied.

Furthermore, activation may be conducted after forming a first interlayer insulating film. In the case where a wiring material used for wiring is weak to heat, it is preferable to conduct activation after forming an interlayer insulating film (insulating film mainly containing silicon, e.g., silicon nitride film) in order to protect wiring and the like, as in this embodiment.

Furthermore, heat treatment is conducted at 300° C. to 550° C. for 1 to 12 hours in an atmosphere containing 3% to 100% hydrogen, whereby the semiconductor layers are hydrogenated. In this embodiment, heat treatment is conducted at 410° C. for one hour in a nitrogen atmosphere containing about 3% hydrogen. In this step, unpaired connecting ends of the semiconductor layers are terminated with thermally excited hydrogen. As another hydrogenation means, there is plasma hydrogenation (using hydrogen excited with plasma).

Furthermore, hydrogenation may be conducted after a passivation film is formed.

During the above-mentioned steps, impurity regions are formed in the respective semiconductor layers.

Then, the mask 239 made of a resist is removed to conduct third etching process. In this embodiment, using the conductive layers 218 to 222 as a mask, the gate insulating film is etched.

Figure 12A:
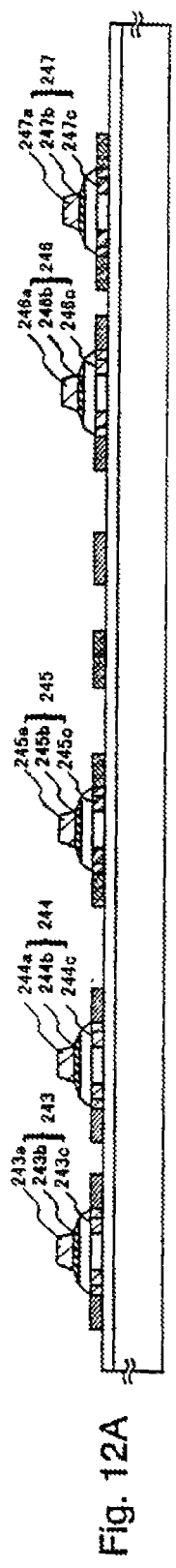
FIGS. 12A to 12C show the steps of producing the sensor portion.

Because of the third etching process, gate insulating films 243c to 247c are formed under the second conductive layers 243b to 247b (FIG. 12A).

Figure 12B:
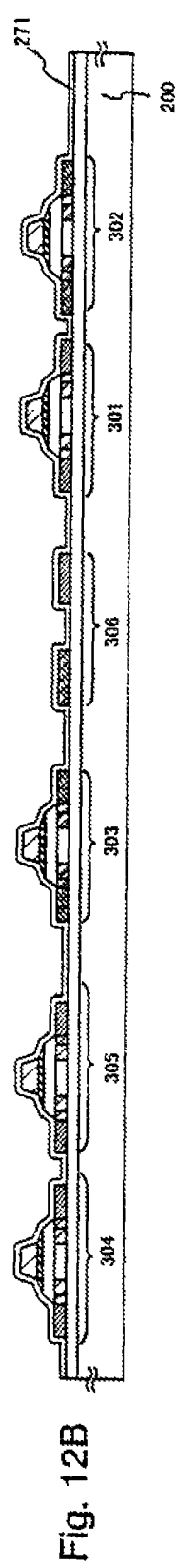

Then, a passivation film 271 is formed so as to cover the substrate 200 (FIG. 12B). The passivation film 271 can be made of a silicon oxide film, a silicon nitride film, or a silicon oxide nitride film. For example, a silicon oxide nitride film made of SiH$_4$, NH$_3$, and N$_2$O may be formed to a thickness of 10 to 800 nm (preferably, 50 to 500 nm) by plasma CVD. Similarly, a hydrogenated silicon oxide nitride film made of SiH$_4$ and N$_2$O may be formed to a thickness of 50 to 800 nm (preferably, 10 to 500 nm). In this embodiment, the passivation film made of nitrogen oxide is formed to a thickness of 10 to 800 nm with a single-layer configuration.

Figure 12C:
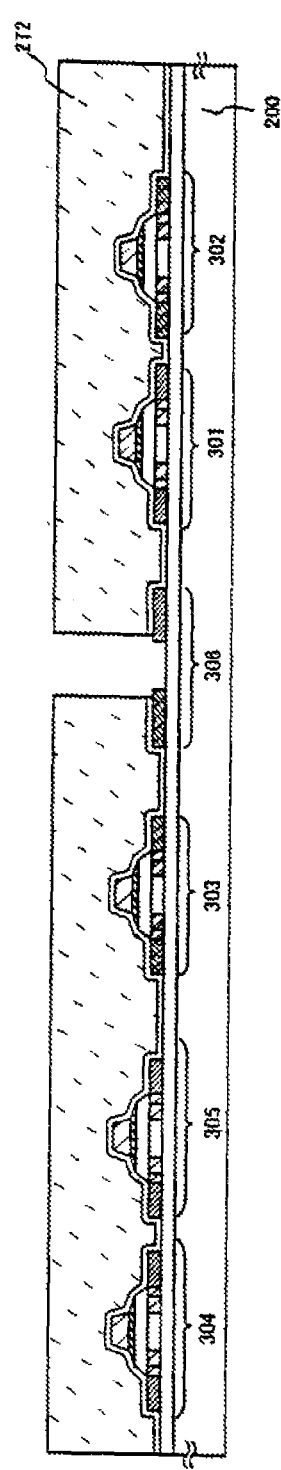

Then, a mask 272 made of a resist is formed by photolithography, and fourth etching process for forming an amorphous silicon film 248 is conducted. The resist mask 272 is formed so as to cover the substrate, and to come into contact with a part of the P-type semiconductor layer 242 and the N-type semiconductor layer 238 (FIG. 12C). Then, only the silicon nitride film is etched. In this embodiment, ICP etching is used, CF$_4$, Cl$_2$, and O$_2$ are used as etching gas, a gas flow ratio is set at 40/60/35 (sccm), and a coil-shaped electrode is supplied with an RF (13.56 MHz) power of 500 W under the pressure of 1 Pa to generate plasma, whereby etching is conducted.

Figure 13A:
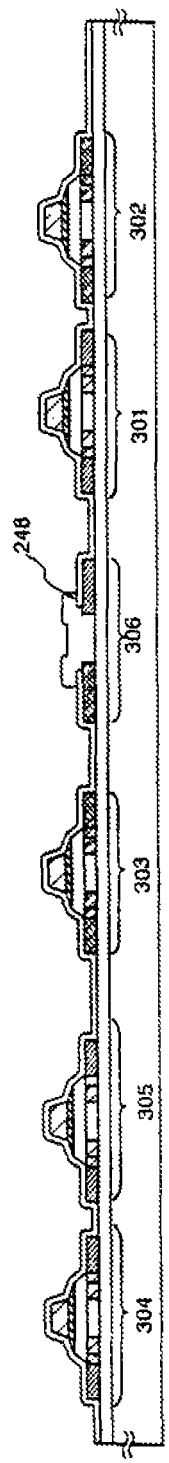
FIGS. 13A to 13C show the steps of producing the sensor portion.

Then, the mask 272 made of a resist is removed. An amorphous silicon film 248 is formed between the N-type semiconductor layer 242 and the P-type semiconductor layer 238 so as to come into contact with a part of the N-type semiconductor layer 242 and the P-type semiconductor layer 238 (FIG. 13A). The semiconductor film having an amorphous structure is formed by a known method (e.g., sputtering, LPCVD, plasma CVD, or the like). The amorphous silicon film 248 is formed to a thickness, preferably one to ten times that of the N-channel type semiconductor layer 242 and the P-channel type semiconductor layer 238. In this embodiment, the amorphous silicon film 248 is formed to a thickness of 25 to 800 nm. Although there is no particular limit to a material for the crystalline semiconductor film, it may be preferably formed of silicon or a silicon germanium ($Si_xGe_{1-x}$) alloy. In this embodiment, after an amorphous silicon film with a thickness of 55 nm is formed by plasma CVD, a solution containing nickel is held onto the amorphous silicon film.

Figure 13B:
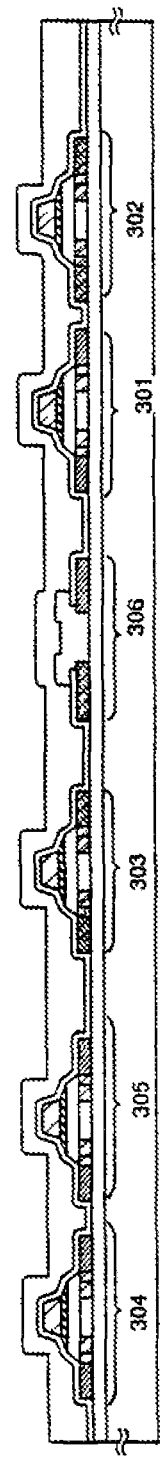
Figure 13C:
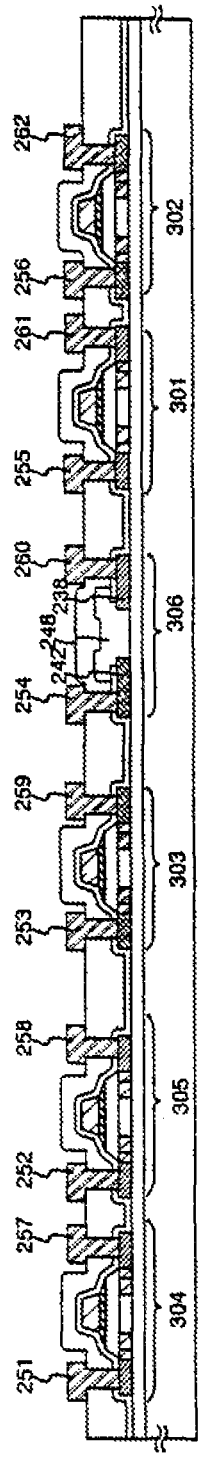

Then, a first interlayer insulating film 235 is formed (FIG. 13B). The first interlayer insulating film 235 is obtained by forming an insulating film containing silicon to a thickness of 100 to 200 nm by plasma CVD or sputtering. In this embodiment, a silicon oxide nitride film with a thickness of 150 nm is formed by plasma CVD. Needless to say, the first interlayer insulating film 235 is not limited to a silicon oxide nitride film. Another insulating film containing silicon may be formed as a single-layer or multi-layer configuration. Then, the first interlayer insulating film 249 is patterned so as to form contact holes reaching the impurity regions 232a, 233a, 235a, 238, 240a, 241a, and 242.

Then, source lines 251 to 256, and drain lines 257 to 262 are formed. In this embodiment, as these lines, a film mainly containing Al or Ag, or a material having excellent reflectivity such as a layered film thereof are desirably used.

Then, as shown in FIG. 14A, a second interlayer insulating film 249 is formed. By using resin such as polyimide, polyamide, polyimideamide, and acrylic resin, the second interlayer insulating film 249 can have a flat surface. In this embodiment, a polyimide film with a thickness of 0.7 μm is formed over the entire surface of the substrate as the second interlayer insulating film 249.

Next, as shown in FIG. 14B, a bank 268 made of a resin material is formed. The bank 268 may be formed by patterning an acrylic film or a polyimide film with a thickness of 1 to 2 μm. The bank 268 may be formed along the source line 256 or the gate line (not shown). The bank 268 may be used as a shielding film by mixing a pigment or the like in the resin material forming the bank 268.

Then, an EL layer 266 is formed. More specifically, an organic EL material to be the EL layer 266 dissolved in a solvent such as chloroform, dichloromethane, xylene, toluene, tetrahydrofuran, and the like is applied, and thereafter, the solvent is vaporized by heat treatment. Thus, a coating (EL layer) made of an organic EL material is formed.

In this embodiment, only one pixel is shown. However, a light-emitting layer emitting red light, a light-emitting layer emitting green light, and a light-emitting layer emitting blue light are formed simultaneously with the formation of the EL layer. In this embodiment, as the light-emitting layer emitting red light, cyanopolyphenylenevinylene is formed to a thickness of 50 nm. Similarly, as the light-emitting layer emitting green light, polyphenylenevinylene is formed to a thickness of 50 nm, and as the light-emitting layer emitting blue light, polyalkylphenylene is formed to a thickness of 50 nm. Furthermore, 1,2-dichloromethane is used as a solvent, and the solvent is vaporized by heat treatment with a hot plate at 80° C. to 150° C. for 1 to 5 minutes.

In this embodiment, although the EL layer has a single-layer configuration, a hole injection layer, a hole transport layer, an electron injection layer, an electron transport layer, and the like may be additionally provided. Various examples of combinations have already been reported, and any configuration may be used.

After the EL layer 266 is formed, a positive electrode 267 made of a transparent conductive film is formed to a thickness of 120 nm as a counter electrode. In this embodiment, a transparent conductive film is used, in which 10 to 20% by weight of zinc oxide is added to indium oxide. The positive electrode 267 is preferably formed by vapor deposition at room temperature so as not to degrade the EL layer 266.

As described above, the buffer TFT 304, the selective TFT 305, the reset TFT 303, the diode 306, the switching TFT 301, the EL driving TFT 302, and the EL element 269 can be formed on the same substrate.

In this embodiment, Embodiments 1 to 5 can be arbitrarily combined.

Embodiment 8

In a method of producing a sensor portion of the area sensor of the present invention, a method of producing a photodiode different from that in Embodiment 6 will be described with reference to FIG. 16.

Figure 16:
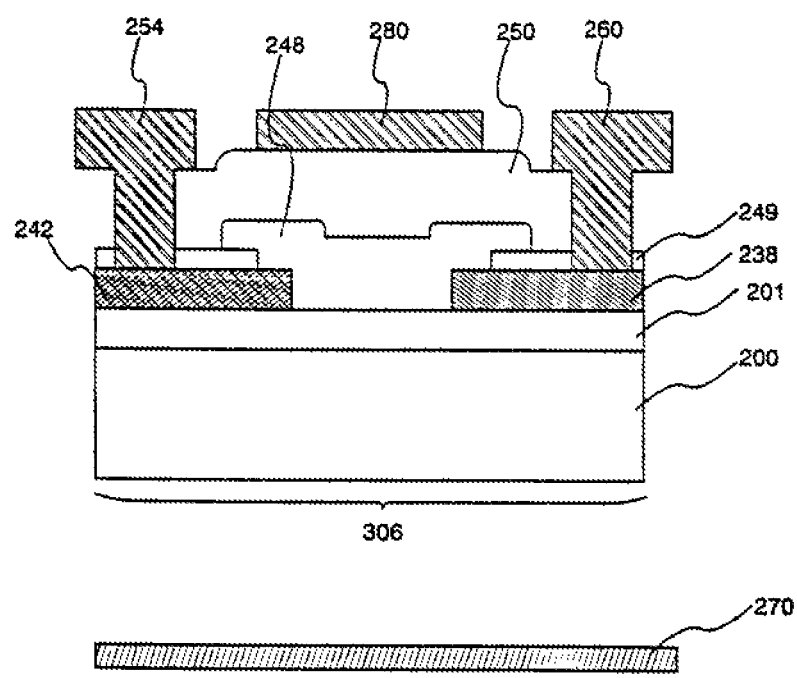
FIG. 16 is an enlarged view of a photodiode according to the present invention.

FIG. 16 is an enlarged view of a photodiode 306. As shown in FIG. 16, in the photodiode 306, a metal film 280 is formed on a first interlayer insulating film 250. The metal film 280 can be formed simultaneously with formation of a source line 254 and a drain line 260. As the metal film 280, a film mainly containing Al or Ag that is the same material as that of the lines, or a material having excellent reflectivity such as a compound film thereof is desirably used.

Light is radiated to a subject 270 from an EL element, and light reflected form the subject 270 is radiated to the photodiode 306. However, in this case, among light passing through the photodiode 306, there exists light that is not radiated to a photoelectric conversion layer 248. If the metal film 280 is present as shown in FIG. 16, such light is reflected from the metal film 280, whereby the photoelectric conversion layer 248 can receive it. Because of this, the photoelectric conversion layer 248 can receive more light.

In this embodiment, Embodiments 1 to 7 can be arbitrarily combined.

Embodiment 9

In this embodiment, an exemplary EL display apparatus (light-emitting apparatus) produced according to the present invention will be described with reference to FIGS. 17A-17B and 18A-18C.

Figure 17A:
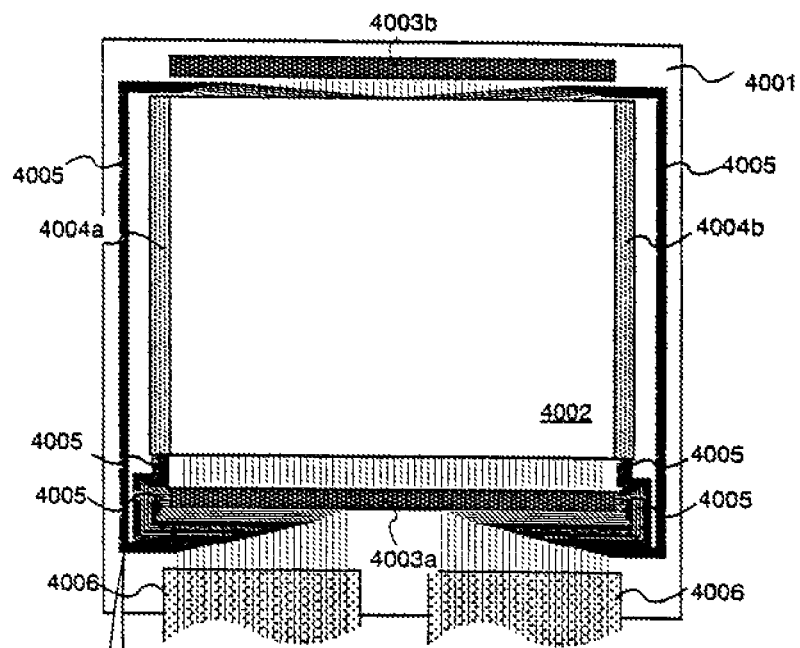
FIGS. 17A and 17B are top views of the sensor portion of an area sensor of the present invention.

FIG. 17A is a top view of a TFT substrate of an EL display apparatus of the present invention. In the present specification, the TFT substrate refers to the one on which a pixel portion is provided.

A pixel portion 4002, a source signal line driving circuit 4003a for a sensor, a source signal line driving circuit 4003b for an EL element, a gate signal line driving circuit 4004a for an EL element, and a gate signal line driving circuit 4004b for a sensor are provided on a substrate 4001. According to the present invention, the number of the source signal line driving circuits and the gate signal line driving circuits are not limited to those shown in FIG. 17A. The number of the source signal line driving circuits and the gate signal line driving circuits can be appropriately set by a designer. In this embodiment, although the source signal line driving circuits and the gate signal line driving circuits are provided on the TFT substrate, the present invention is not limited thereto. The source signal line driving circuits and the gate signal line driving circuits provided on a substrate separate from the TFT substrate may be electrically connected to the pixel portion via FPCs or the like.

Reference numeral 4005 denotes drawing-around wiring connected to a power supply line (not shown) provided in the pixel portion 4002. Reference numeral 4005 also denotes drawing-around wiring for a gate connected to the gate signal line driving circuit 4004a for a sensor and the gate signal line driving circuit 4004b for a gate. Reference numeral 4005 also denotes drawing-around wiring for a source connected to the source signal line driving circuit 4003*a* for a sensor and the source signal line driving circuit 4003*b* for an EL element.

The drawing-around wiring 4005 for a gate and the drawing-around wiring 4005 for a source are connected to an IC and the like provided outside of the substrate 4001 via the FPCs 4006. The drawing-around wiring 4005 is also connected to a power source provided outside of the substrate 4001 via the FPCs 4006.

Figure 17B:
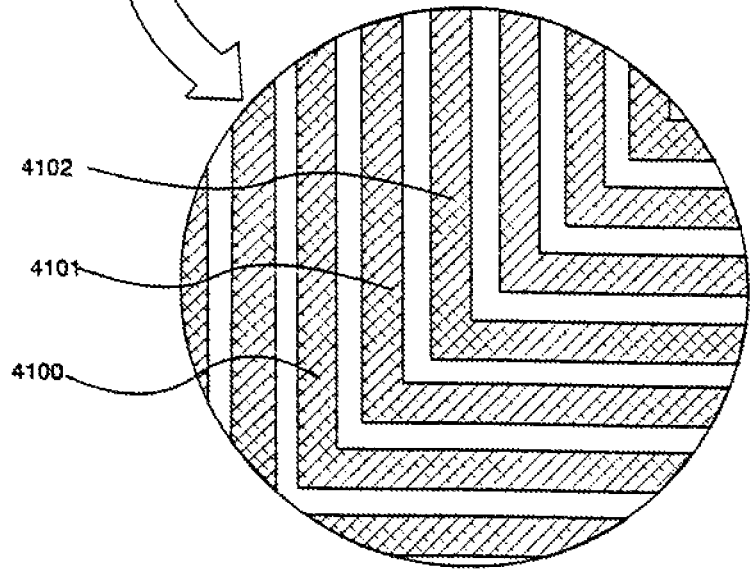

FIG. 17B shows an enlarged view of the drawing-around wiring 4005. Reference numeral 4100 denotes drawing-around wiring for R, 4101 denotes drawing-around wiring for G, and 4102 denotes drawing-around wiring for B.

Figure 18A:
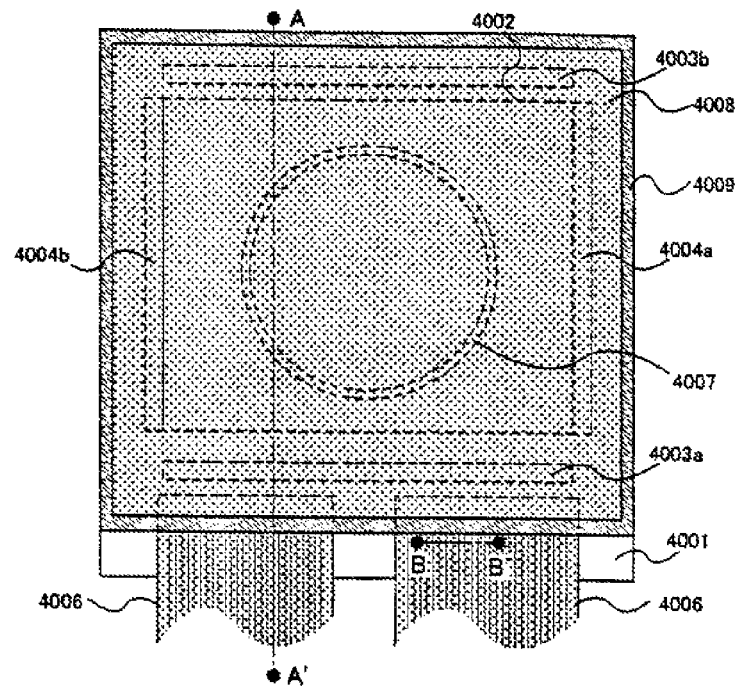
FIGS. 18A to 18C show a schematic view and cross-sectional views of the sensor portion of the area sensor of the present invention.
Figure 18B:
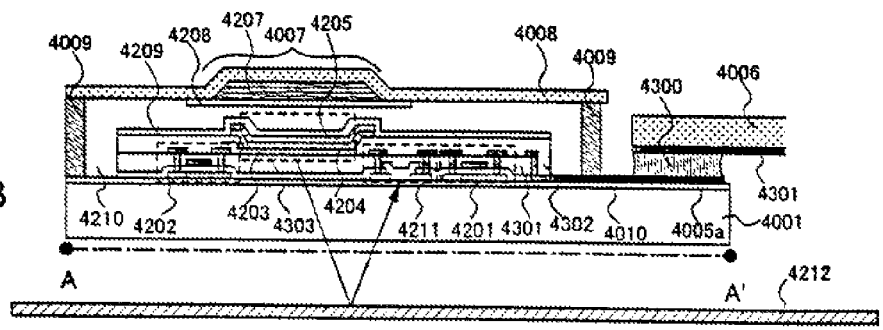
Figure 18C:
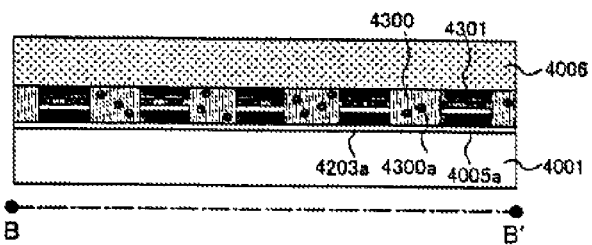

FIG. 18A shows a top view of an area sensor formed by sealing the TFT substrate shown in FIG. 17A with a sealant. FIG. 18B shows a cross-sectional view taken along a line A-A' in FIG. 18A, and FIG. 18C shows a cross-sectional view taken along a line B-B' in FIG. 18A. The same components as those shown in FIGS. 17A and 17B are denoted with the same reference numerals as those therein.

A sealant 4009 is provided so as to surround the pixel portion 4002, the source signal line driving circuit 4003*a* for a sensor, the source signal line driving circuit 4003*b* for an EL element, the gate signal line driving circuit 4004*a* for a sensor, and the gate signal line driving circuit 4004*b* for an EL element formed on the substrate 4001. Furthermore, a sealing member 4008 is provided above the pixel portion 4002, the source signal line driving circuit 4003*a* for a sensor, the source signal line driving circuit 4003*b* for an EL element, the gate signal line driving circuit 4004*a* for a sensor, and the gate signal line driving circuit 4004*b* for an EL element. Thus, the pixel portion 4002, the source signal line driving circuit 4003*a* for a sensor, the source signal line driving circuit 4003*b* for an EL element, the gate signal line driving circuit 4004*a* for a sensor, and the gate signal line driving circuit 4004*b* for an EL element are sealed with the substrate 4001, the sealant 4009, and the sealing member 4008, using a filler 4210.

Furthermore, the pixel portion 4002, the source signal line driving circuit 4003*a* for a sensor, the source signal line driving circuit 4003*b* for an EL element, the gate signal line driving circuit 4004*a* for a sensor, and the gate signal line driving circuit 4004*b* for an EL element provided on the substrate 4001 have a plurality of TFTs. FIG. 18B typically shows driving TFTs (herein, an N-channel type TFT and a P-channel type TFT are shown) 4201 included in the source signal line driving circuit 4003, and an EL driving TFT (i.e., TFT for controlling a current to an EL element) and a photodiode 4211 included in the pixel portion, formed on a base film 4010.

In this embodiment, as the driving TFT 4201, a P-channel type TFT or an N-channel type TFT produced by a known method is used. As the EL driving TFT 4202, a P-channel type TFT produced by a known method is used. Furthermore, in the pixel portion 4002, a retention capacitance (not shown) connected to a gate of the EL driving TFT 4202 is provided.

An interlayer insulating film (flattening film) 4301 is formed on the driving TFT 4201, the EL driving TFT 4202, and the photodiode 4211. A pixel electrode (positive electrode) 4203 electrically connected to a drain of the EL driving TFT 4202 is formed on the interlayer insulating film 4301. As the pixel electrode 4203, a transparent conductive film with a large work function is used. As the transparent conductive film, a compound of indium oxide and tin oxide, a compound of indium oxide and zinc oxide, zinc oxide, tin oxide, or indium oxide can be used. Furthermore, gallium may be added to the transparent conductive film.

On the pixel electrode 4203, an insulating film 4302 is formed. The insulating film 4302 has an opening in a portion corresponding to the pixel electrode 4203. In this opening, an EL layer 4204 is formed on the pixel electrode 4203. As the EL layer 4204, a known organic EL material or an inorganic EL material can be used. There are a low-molecular type (monomer type) material and a high-molecular type (polymer type) material as the organic EL material. Either material may be used.

The EL layer 4204 may be formed by a known vapor deposition technique or a coating technique. Furthermore, the EL layer may have a multi-layer configuration or a single-layer configuration by arbitrarily combining a hole injection layer, a hole transport layer, a light-emitting layer, an electron transport layer, or an electron injection layer.

On the EL layer 4204, a negative electrode 4205 made of a conductive film (typically, conductive film mainly containing aluminum, copper, or silver, or a layered film composed of this conductive film and another conductive film) having a light shielding property is formed. Furthermore, it is desirable to exclude moisture and oxygen present on an interface between the negative electrode 4205 and the EL layer 4204 as much as possible. Thus, it is required to form the EL layer 4204 in an atmosphere of nitrogen or noble gas, and to form the negative electrode 4205 without bringing it into contact with oxygen and moisture. In this embodiment, the above-mentioned film-formation is possible by using a film-formation apparatus of a multi-chamber system (cluster-tool system). The negative electrode 4205 is supplied with a predetermined voltage.

As described above, an EL element 4303 composed of the pixel electrode (positive electrode) 4203, the EL layer 4204, and the negative electrode 4205 is formed. Then, a protective film 4209 is formed on the insulating film 4302 so as to cover the EL element 4303. The protective film 4209 is effective for preventing oxygen, moisture, and the like from entering the EL element 4303.

Reference numeral 4005 denotes drawing-around wiring connected to a power supply line, which is electrically connected to a source region of the EL driving TFT 4202. The drawing-around wiring 4005 extends between the sealant 4009 and the substrate 4001, and is electrically connected to wiring 4301 of the FPCs via an anisotropic conductive film 4300.

As the sealing member 4008, a glass material, a metal material (typically, a stainless material), a ceramics material, and a plastic material (including a plastic film) can be used. As the plastic material, a fiberglass-reinforced plastic (FRP) plate, a polyvinyl fluoride film (PVF), a myler film, a polyester film, or an acrylic resin film can be used. Furthermore, a sheet having a configuration in which an aluminum foil is interposed between a PVF film and a myler film can also be used.

In the case where light is radiated from an EL element toward a cover member side, the cover member must be transparent. In this case, a transparent material, such as a glass plate, a plastic plate, a polyester film, or an acrylic film, is used for the cover member.

As the filler 4210, UV-curable resin or thermosetting resin, as well as inert gas such as nitrogen and argon, can be used. More specifically, polyvinyl chloride (PVC), acrylic resin, polyimide, epoxy resin, silicon resin, polyvinyl butyral (PVB), or ethylenevinyl acetate (EVA) can be used. In this embodiment, nitrogen is used as the filler.

In order to expose the filler 4210 to a moisture-absorbing material (preferably, barium oxide) or an oxygen-adsorbing material, a concave portion 4007 is provided on the surface of the sealing member 4008 on the substrate 4001 side, and a moisture-absorbing material or an oxygen-adsorbing material 4207 is disposed therein. The moisture-absorbing material or oxygen-adsorbing material 4207 is held in the concave portion 4007 by a concave portion cover member 4208 so as not to scatter. The concave portion cover member 4208 has a fine mesh shape which transmits air and moisture but does not transmit the moisture-absorbing material or the oxygen-adsorbing material 4207. By providing the moisture-absorbing material or the oxygen-adsorbing material 4207, the EL element 4303 can be prevented from being degraded.

As shown in FIG. 18C, a conductive film 4203a is formed so as to come into contact with the drawing-around wiring 4005a, simultaneously with the formation of the pixel electrode 4203.

Furthermore, the anisotropic conductive film 4300 contains a conductive filler 4300a. By thermally crimping the substrate 4001 onto the FPC 4006, the conductive film 4203a on the substrate 4001 and the wiring 4301 for an FPC on the FPC 4006 are electrically connected to each other via the conductive filler 4300a.

In this embodiment, Embodiments 1 to 7 can be arbitrarily combined.

Embodiment 10

Figure 19A:
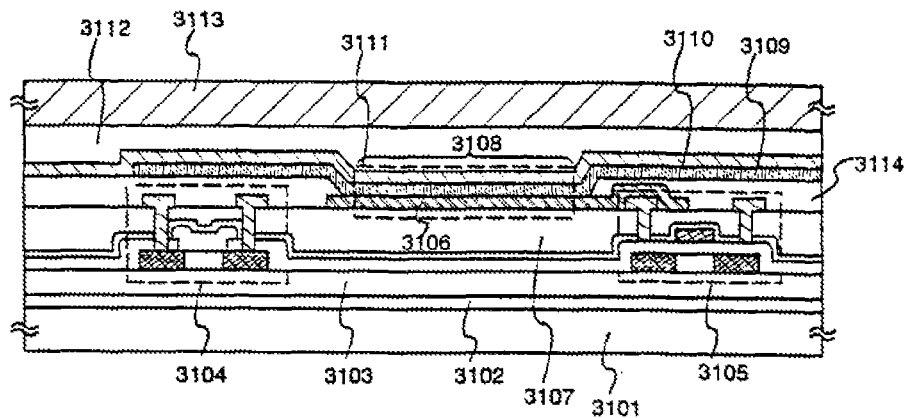
FIGS. 19A to 19C show the production steps according to the present invention.
Figure 19B:
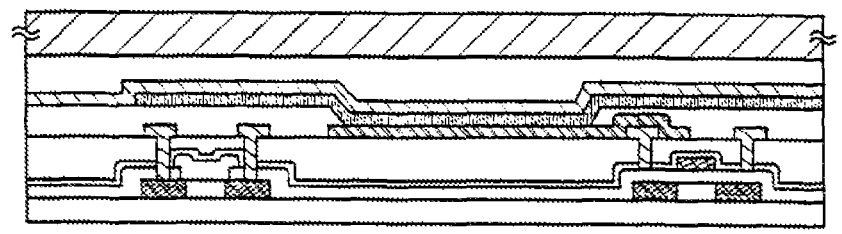
Figure 19C:
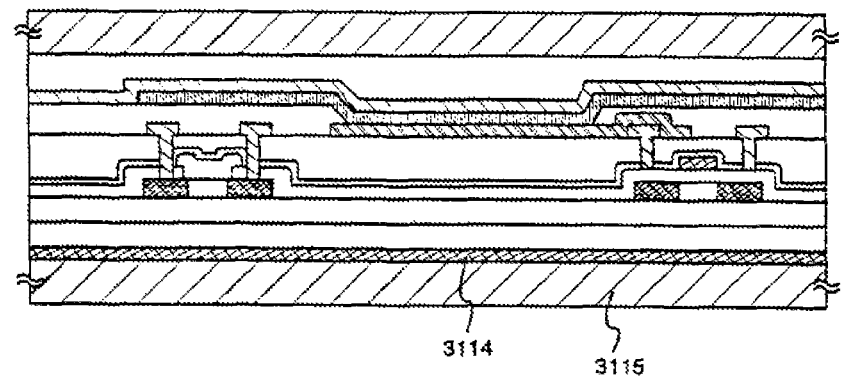

In this embodiment, the case will be described with reference to FIGS. 19A to 19C, in which TFTs and EL elements are sealed onto a substrate with a sealing member, and thereafter, the substrate is replaced. FIGS. 19A to 19C are cross-sectional views showing the steps of producing a pixel portion.

In FIG. 19A, reference numeral 3101 denotes a substrate (hereinafter, referred to as a "device forming substrate") on which devices are to be formed. On the substrate 3101, a peeling layer 3102 made of an amorphous silicon film is formed to a thickness of 100 to 500 nm (300 nm in this embodiment). In this embodiment, although a glass substrate is used as the device forming substrate 3101, a quartz substrate, a silicon substrate, a metal substrate (SUS substrate), or a ceramic substrate may be used.

The peeling layer 3102 may be formed by thermal CVD under reduced pressure, plasma CVD, sputtering, or vapor deposition. On the peeling layer 3102, an insulating film 3103 is made of a silicon oxide film having a thickness of 200 nm. The insulating film 3103 may be formed by thermal CVD under reduced pressure, plasma CVD, sputtering, or vapor deposition.

Furthermore, photodiodes 3104 and EL driving TFTs 3105 are formed on the insulating film 3103. In this embodiment, although the EL driving TFTs 3105 are P-channel type TFTs, the present invention is not limited thereto. The EL driving TFTs 3105 may be P-channel type TFTs or N-channel type TFTs.

A first interlayer insulating film 3107 is formed on the photodiodes 3104 and the EL driving TFTs 3105. The first interlayer insulating film 3107 is formed covering the photodiodes 3104 and the EL driving TFTs 3105, so as to flatten pixel electrodes 3106 (formed later).

Each pixel electrode 3106 is formed so as to be electrically connected to a drain region of the EL driving TFT 3105. In this embodiment, the pixel electrode 3106 is obtained by forming a transparent conductive film (typically, a compound film of indium oxide and tin oxide) having a thickness of 100 nm, followed by patterning. The pixel electrode 3106 functions as a positive electrode of an EL element.

After the pixel electrodes 3106 are formed, a second interlayer insulating film 3114 made of a silicon oxide film with a thickness of 300 nm is formed. Openings 3108 are formed in the second interlayer insulating film 3114, and EL layers 3109 with a thickness of 70 nm and a negative electrode 3110 with a thickness of 300 nm are formed by vapor deposition. In this embodiment, the EL layer 3109 has a configuration in which a hole injection layer with a thickness of 20 nm and a light-emitting layer with a thickness of 50 nm are stacked. Needless to say, another known configuration may be used in which a hole-injection layer, a hole transport layer, an electron transport layer, or an electron injection layer are combined with a light-emitting layer.

As described above, an EL element 3111 composed of the pixel electrode (positive electrode) 3106, the EL layer 3109, and the negative electrode 3110 is obtained. In this embodiment, the EL element 3111 functions as a light-emitting element.

Next, a substrate (hereinafter, referred to as a "sealing member") 3113 for fixing the devices is attached to the layered configuration obtained as described above with a first adhesive 3112. In this embodiment, although an elastic plastic film is used as the sealing member 3113, a glass substrate, a quartz substrate, a plastic substrate, a silicon substrate, or a ceramic substrate may be used. As the first adhesive 3112, it is required to use a material that can allow the peeling layer 3102 to be selectively removed later.

Typically, an insulating film made of resin can be used. In this embodiment, although polyimide is used, acrylic resin, polyamide, or epoxy resin may be used. If the adhesive 3112 is positioned on a side of an observer (i.e., on a side of a user of an electrooptical apparatus) seen from the EL elements, a material that transmits light needs to be used.

The first adhesive 3112 can shut off the EL elements from the atmosphere. This can substantially completely suppress the degradation of an organic EL material due to oxidation, and the reliability of the EL elements can be substantially enhanced.

Next, as shown in FIG. 19B, the peeling layer 3102 is removed, whereby the device forming substrate 3101 and the insulating film 3103 are peeled off. In this embodiment, peeling is conducted by exposing the peeling layer 3102 to gas containing halogen fluoride. In this embodiment, chloride fluoride ($ClF_3$) is used as halogen fluoride, and nitrogen is used as diluted gas. As the diluted gas, argon, helium, or neon may be used. The flow rate of $ClF_3$ and nitrogen may be set at 500 sccm ($8.35 \times 10^{-6}$ m$^3$/s), and a reaction pressure thereof may be set at 1 to 10 Torr ($1.3 \times 10^2$ to $13 \times 10^3$ Pa). Furthermore, a treatment temperature may be a room temperature (typically, 20° C. to 27° C.).

In the above-mentioned case, although a silicon film is etched, a plastic film, a glass substrate, a polyimide film, and a silicon oxide film are not etched. More specifically, the peeling layer 3102 is selectively etched by being exposed of $ClF_3$ gas, and finally removed completely. The active layers of the photodiode 3104 and the EL driving TFT 3105 similarly formed of a silicon film are covered with the first interlayer insulating film 3107. Therefore, they are not exposed to $ClF_3$ gas and hence, are not etched.

In the case of this embodiment, the peeling layer 3102 is gradually etched from exposed ends. When the peeling layer 3102 is removed completely, the device forming substrate 3101 and the insulating film 3103 are separated. At this time, the TFTs and EL elements formed of stacked thin films remain on the side of the sealing member 3113.

Herein, the peeling layer 3102 is etched from the ends thereof. When the device forming substrate 3101 is increased in size, it takes a longer time for the peeling layer 3102 to be completely removed, which is not preferable. Thus, the peeling layer 3102 is removed by etching, desirably when the device forming substrate 3101 has a size of 3 inches or less (preferably, one inch or less), measured from the upper left corner to the lower right corner.

In this embodiment, the peeling layer 3102 is removed by etching in an atmosphere of $CIF_3$ gas. The present invention is not limited thereto. It may also be possible that a laser beam is radiated to the peeling layer 3102 from the device forming substrate 3101 side to vaporize the peeling layer 3102, whereby the device forming substrate 3101 is peeled off. In this case, it is required to appropriately select the kind of a laser beam and the material for the device forming substrate 3101 so that a laser beam passes through the device forming substrate 3101. For example, when a quartz substrate is used as the device forming substrate 3101, a YAG laser (fundamental (1064 nm), second harmonic (532 nm), third harmonic (355 nm), fourth harmonic (266 nm)) or an excimer laser (wavelength: 308 nm) is used to form a line-shaped beam and the line-shaped beam may be allowed to pass through the quartz substrate. An excimer laser does not pass through a glass substrate. Therefore, if a glass substrate is used as the device forming substrate 3101, a fundamental, a second harmonic, and a third harmonic of the YAG laser (preferably, the second harmonic (wavelength: 532 nm)) is used to form a line-shaped beam, and the line-shaped beam may be allowed to pass through a glass substrate.

In the case of conducting peeling by using a laser beam, the peeling layer 3102 that is vaporized with a laser beam to be radiated is used.

In addition to the method of using a laser beam, it may also be possible that the device forming substrate 3101 is peeled off by dissolving the peeling layer 3102 in a solution. In this case, it is preferable to use a solution that allows the peeling layer 3102 to be selectively dissolved.

When the TFTs and the EL elements are transferred to the sealing member 3113, as shown in FIG. 19C, a second adhesive 3114 is formed, and a second device forming substrate 3115 is attached. As the second adhesive 3114, an insulating film made of resin (typically, polyimide, acrylic resin, polyamide, or epoxy resin) may be used. Alternatively, an inorganic insulating film (typically, a silicon oxide film) may be used. In the case where the second adhesive 3114 is positioned on an observer side, seen from the EL elements, a material transmitting light needs to be used.

As described above, the TFTs and the EL elements are transferred from the device forming substrate 3101 to the second device forming substrate 3115. Consequently, an EL display apparatus interposed between the sealing member 3113 and the second device forming substrate 3115 can be obtained. If the sealing member 3113 and the second device forming substrate 3115 are made of the same material, thermal expansion coefficients thereof become equal to each other. Therefore, the apparatus becomes unlikely to be influenced by stress distortion due to a change in temperature.

In the EL display apparatus produced in this embodiment, the material for the sealing member 3113 and the second device forming substrate 3115 can be selected without being influenced by heat resistance during a process of TFTs. For example, a plastic substrate can be used as the sealing member 3113 and the second device forming substrate 3115, whereby a flexible EL display apparatus can be created.

This embodiment can be carried out by being arbitrarily combined with any of the configurations shown in Embodiments 1 to 8.

Embodiment 11

In this embodiment, the case will be described in which a DLC film is formed over the entire surface of an EL display apparatus or at ends of an EL display apparatus.

Figure 20A:
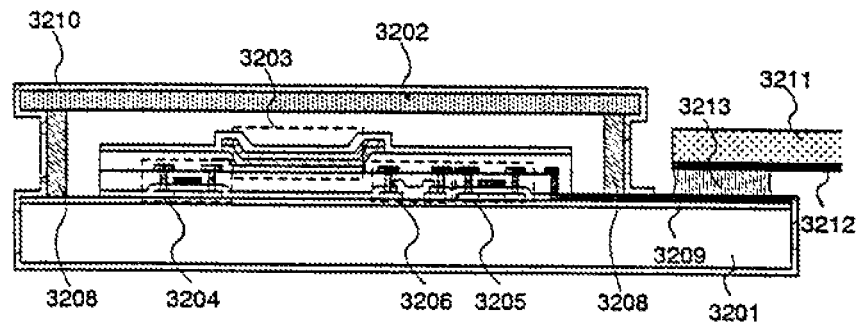
FIGS. 20A and 20B show the production steps according to the present invention.

FIG. 20A is a cross-sectional view of an EL display apparatus in which a DLC film is formed over the entire surface of the apparatus. On a substrate 3201, a switching TFT 3205, an EL driving TFT 3204, and a photodiode 3206 are formed. Reference numeral 3203 denotes an EL element. The EL driving TFT 3204 controls a current flowing through the EL element 3203.

The switching TFT 3205, the EL driving TFT 3204, and the EL element 3203 are sealed with a sealing member 3202 and a sealant 3208 so as to be shut off from outside air. Reference numeral 3209 denotes drawing-around wiring. The drawing-around wiring 3209 extends between the sealant 3208 and the substrate 3201, and is exposed to the outside of the space in which the EL element 3203 is sealed.

Reference numeral 3210 denotes a DLC film. The DLC film 3210 covers the entire EL display apparatus, excluding a part of the drawing-around wiring 3209 exposed to the outside of the space in which the EL element 3203 is sealed.

In this embodiment, a DLC film may be formed by ECR plasma CVD, RF plasma CVD, μ-wave plasma CVD, or sputtering. The DLC film has a Raman spectrum distribution with an asymmetric peak at about 1550 $cm^{-1}$ and a shoulder at about 1300 $cm^{-1}$. The DLC film also exhibits a hardness of 15 to 25 GPa, when measured by minute hardness meter. Such a carbon film protects the surface of a substrate. In particular, a plastic substrate is likely to be damaged. Therefore, covering the surface of the apparatus with a DLC film as shown in FIG. 20A is effective for preventing damage.

The DLC film is also effective for preventing oxygen and water from entering the space in which the EL element 3203 is sealed. Thus, by forming the DLC film 3210 so as to cover the sealant 3208 as in this embodiment, a material promoting the degradation of an EL layer, such as moisture and oxygen, from outside can be prevented from entering the space in which the EL element 3203 is sealed.

When the DLC film 3210 is formed, a part of the drawing-around wiring 3209 exposed to the outside of the space in which the EL element 3203 is sealed is covered with a resist mask or the like, and the resist mask is removed after the DLC film 3210 is formed. A part of the drawing-around wiring 3209 not covered with the DLC film 3210 is connected to wiring 3212 for an FPC provided at an FPC 3211 via an anisotropic conductive film 3213.

Figure 20B:
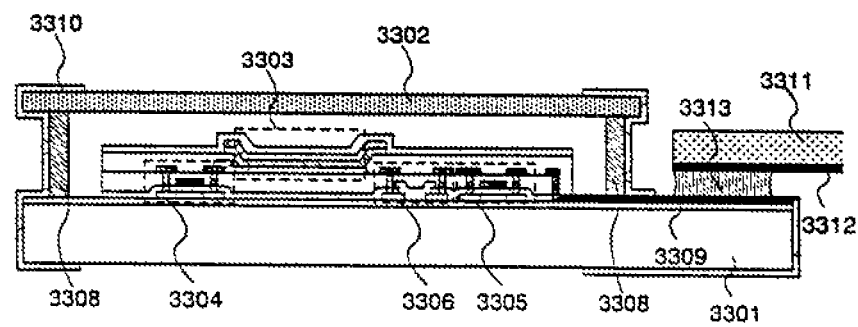

FIG. 20B is a cross-sectional view of an EL display apparatus in the case where a DLC film is formed at ends of the EL display apparatus. On a substrate 3301, a switching TFT 3305, an EL driving TFT 3304, and a photodiode 3306 are formed. Reference numeral 3303 denotes an EL element, and the EL driving TFT 3304 controls a current flowing through an EL element 3303.

The switching TFT 3305, the EL driving TFT 3304, the photodiode 3306, and the EL element 3303 are sealed with a sealing member 3302 and a sealant 3308 so as to be shut off from outside air. Reference numeral 3309 denotes drawing-around wiring. The drawing-around wiring 3309 extends between the sealant 3308 and the substrate 3301, and the EL element 3303 is exposed to the outside of the space in which the EL element 3303 is sealed.

Reference numeral 3310 denotes a DLC film. The DLC film 3310 is formed so as to cover a part of the sealing member 3302, a part of the substrate 3301, and the sealant 3308, excluding a part of the drawing-around wiring 3309 exposed to the outside of the space in which the EL element 3303 is sealed.

The DLC film 3310 is effective for preventing oxygen and water from entering the space in which the EL element 3303 is sealed. Thus, by forming the DLC film 3310 so as to cover the sealant 3308 as in this embodiment, a material promoting the degradation of an EL layer, such as moisture and oxygen, from outside can be prevented from entering the space in which the EL element 3303 is sealed.

In an EL display apparatus shown in FIG. 20B, the DLC film 3310 is formed only at ends (portions including the sealant) of the EL display apparatus. Therefore, it is easy to form the DLC film 3310.

When the DLC film 3310 is formed, a part of the drawing-around wiring 3309 exposed to the outside of the space in which the EL element 3303 is sealed is covered with a resist mask or the like, and the resist mask is removed after the DLC film 3310 is formed. A part of the drawing-around wiring 3309 not covered with the DLC film 3310 is connected to wiring 3312 for an FPC provided at an FPC 3311 via an anisotropic conductive film 3313.

This embodiment can be carried out by being arbitrarily combined with any of the configurations shown in Embodiments 1 to 10.

Embodiment 12

As an exemplary area sensor of the present invention, a portable hand scanner will be described with reference to FIGS. 21A and 21B.

Figure 21A:
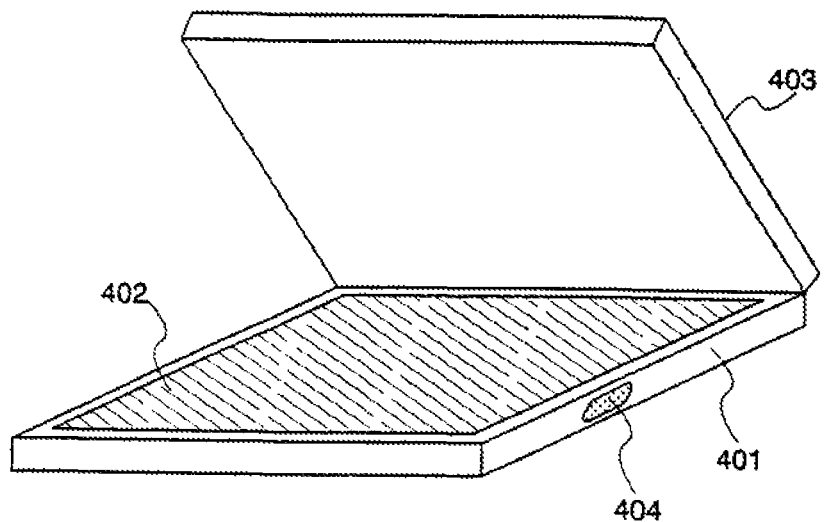
FIGS. 21A and 21B show an outer appearance of a portable hand scanner that is an exemplary area sensor of the present invention.
Figure 21B:
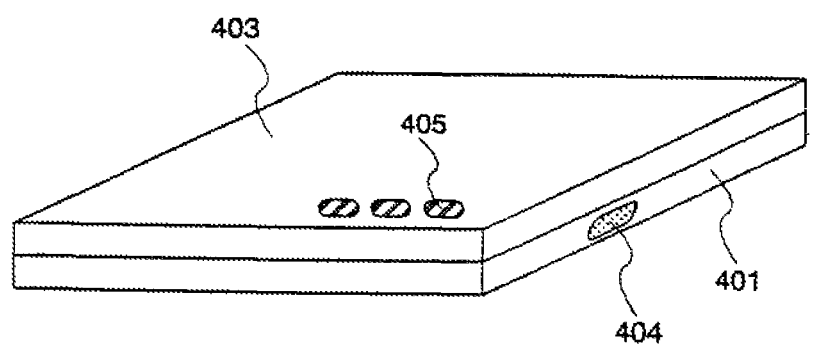

FIG. 21A shows a portable hand scanner, which is composed of a body 401, a sensor portion 402, an upper cover 403, an external connecting port 404, and operation switches 405. FIG. 21B shows a state where the upper cover 403 of the portable hand scanner in FIG. 21A is closed.

The area sensor of the present invention is capable of displaying a read image on the sensor portion 402. Therefore, even if an electronic display is not separately provided to the area sensor, an image can be confirmed as soon as it is read.

The area sensor of the present invention is also capable of sending an image signal read by the sensor portion 402 to electronic equipment connected to the outer side of the portable hand scanner through the external connecting port 404, whereby the image is corrected, synthesized, edited, and the like on software.

This embodiment can be arbitrarily combined with any of Embodiments 1 to 11.

Embodiment 13

Figure 22:
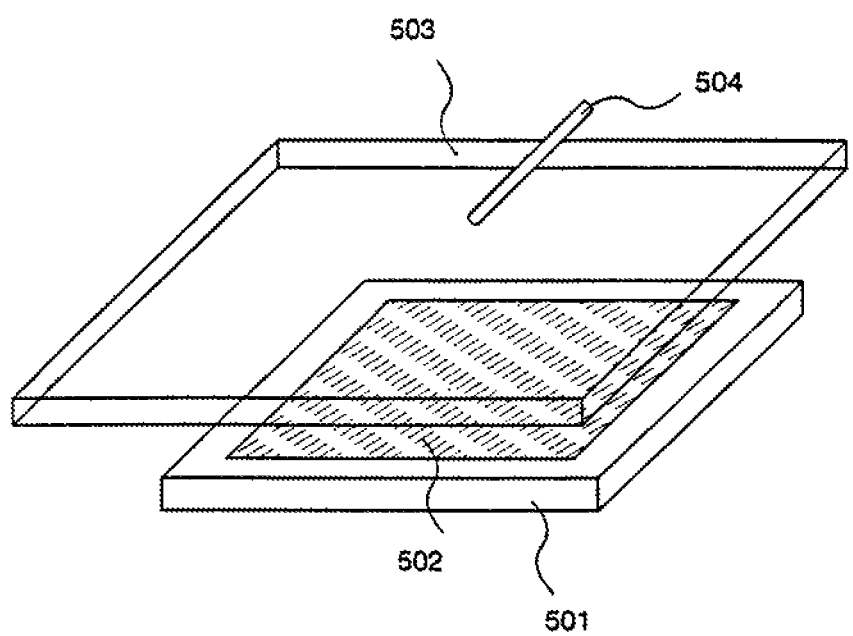
FIG. 22 shows an outer appearance of an area sensor provided with a touch panel that is an exemplary area sensor of the present invention.
Figure 23A:
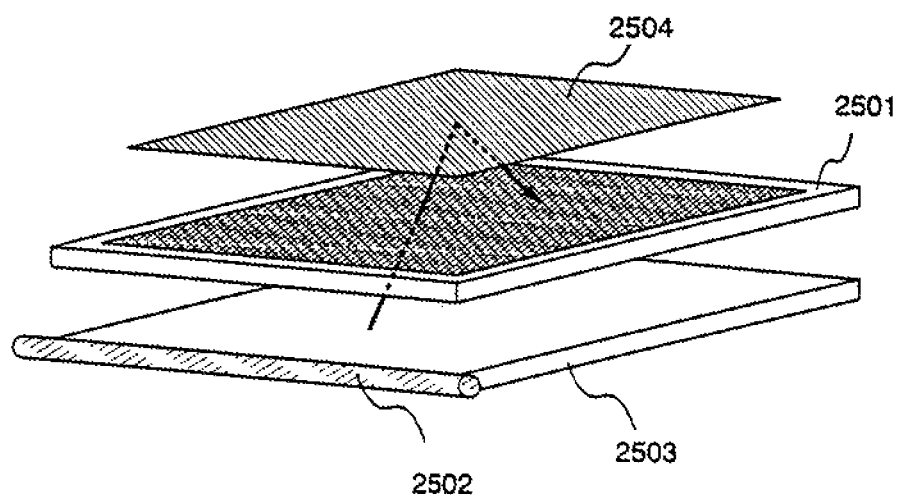
FIGS. 23A and 23B are a perspective view and a cross-sectional view of a conventional area sensor.
Figure 23B:
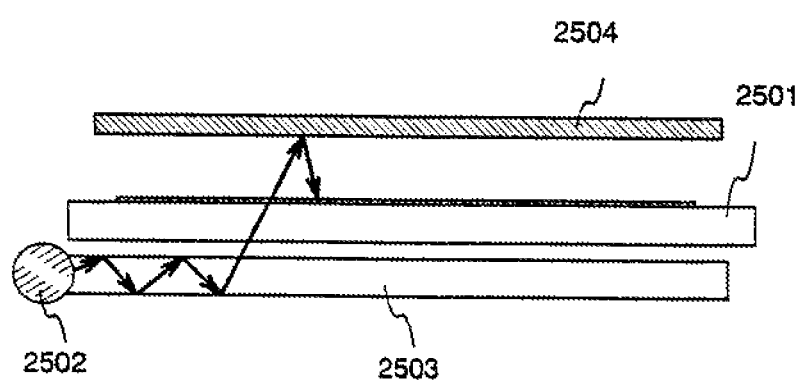

As an exemplary area sensor of the present invention, a portable hand scanner different from that of Embodiment 12 will be described with reference to FIG. 22.

Reference numeral 501 denotes a sensor substrate, 502 denotes a sensor portion, 503 denotes a touch panel, and 504 denotes a touch pen. The touch panel 503 has light transparency. Because of this, the touch panel 503 can transmit light emitted from the sensor portion 502 and light incident upon the sensor portion 502, and an image on a subject can be read through the touch panel 503. In the case where an image is displayed on the sensor portion 502, an image on the sensor portion 502 can be seen through the touch panel 503.

When the touch pen 504 contacts the touch panel 503, information at a position where the touch pen 504 is in contact with the touch panel 503 can be captured in an area sensor as an electric signal. As the touch panel 503 and the touch pen 504 used in this embodiment, any known members can be used, as long as the touch panel 503 has light transparency, and information at a position where the touch pen 504 contacts the touch panel 503 can be captured in an area sensor as an electric signal.

The area sensor of the present invention having the above-mentioned configuration is capable of reading an image, displaying the read image on the sensor portion 502, and writing to the captured image with the touch pen 504. In the area sensor of the present invention, read of an image, display of an image, write to an image can be all conducted in the sensor portion 502. Thus, the size of the area sensor can be minimized, and the area sensor is allowed to have various functions.

This embodiment can be arbitrarily combined with any of Embodiments 1 to 12.

Embodiment 14

In this embodiment, a configuration of a sensor portion of an area sensor will be described, which is different from that shown in FIG. 1.

Figure 24:
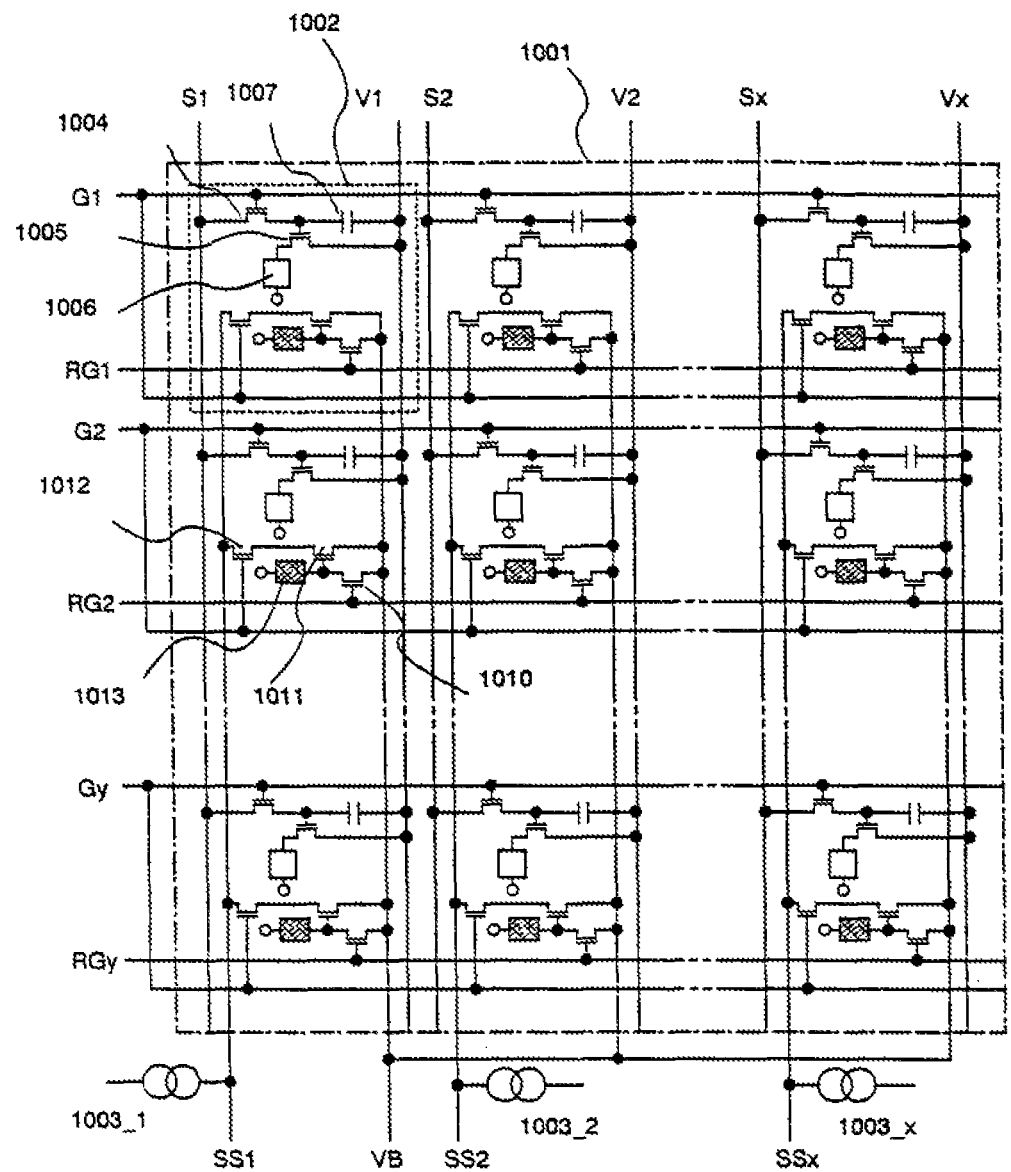
FIG. 24 is a circuit diagram of a sensor portion.

FIG. 24 shows a circuit diagram of a sensor portion of an area sensor of this embodiment. A sensor portion 1001 is provided with source signal lines $S_1$ to $S_x$, power supply lines $V_1$ to $V_x$, gate signal lines $G_1$ to $G_y$, reset gate signal lines $RG_1$ to $RG_y$, sensor output lines $SS_1$ to $SS_x$, and a sensor power source line VB.

The sensor portion 1001 has a plurality of pixels 1002. Each pixel 1002 includes one of the source signal liens $S_1$ to $S_x$, one of power supply lines $V_1$ to $V_x$, one of gate signal lines $G_1$ to $G_y$, one of reset gate signal lines $RG_1$ to $RG_y$, one of sensor output lines $SS_1$ to $SS_x$, and the sensor power source line VB.

The sensor output lines $SS_1$ to $SS_x$ are respectively connected to constant current power sources $1003\_1$ to $1003\_x$.

The pixel 1002 includes a switching TFT 1004, an EL driving TFT 1005, and an EL element 1006. In FIG. 24, although a capacitor 1007 is provided in the pixel 1002, the capacitor 1007 may not be provided. The pixel 1002 further includes a reset TFT 1010, a buffer TFT 1011, a selective TFT 1012, and a photodiode 1013.

The EL element 1006 is composed of a positive electrode, a negative electrode, and an EL layer provided between the positive electrode and the negative electrode. In the case where the positive electrode is connected to a source region or a drain region of the EL driving TFT 1005, the positive electrode functions as a pixel electrode and the negative electrode functions as a counter electrode. In contrast, in the case where the negative electrode is connected to a source region or a drain region of the EL driving TFT 1005, the positive electrode functions as a counter electrode and the negative electrode functions as a pixel electrode.

A gate electrode of the switching TFT 1004 is connected to the gate signal line ($G_1$ to $G_y$). One of a source region and a drain region of the switching TFT 1004 is connected to the source signal line ($S_1$ to $S_x$), and the other is connected to the gate electrode of the EL driving TFT 1005.

One of the source region and the drain region of the EL driving TFT 1005 is connected to the power supply line ($V_1$ to $V_x$), and the other is connected to the EL element 1006. The capacitor 1007 is provided so as to be connected to the gate electrode of the EL o10 driving TFT 1005 and the power supply line ($V_1$ to $V_x$).

A gate electrode of the reset TFT 1010 is connected to the reset gate signal line ($RG_1$ to $RG_x$). A source region of the reset TFT 1010 is connected to the sensor power source line VB. The sensor power source line VB is always kept at a constant electric potential (reference potential). A drain region of the reset TFT 1010 is connected to the photodiode 1013 and a gate electrode of the buffer TFT 1011.

Although not shown in the figure, the photodiode 1013 has an N-type semiconductor layer, a P-type semiconductor layer, and a photoelectric conversion layer provided between the N-type semiconductor layer and the P-type semiconductor layer. The drain region of the reset TFT 1010 is connected to either the P-type semiconductor layer or the N-type semiconductor layer of the photodiode 1013.

A drain region of the buffer TFT 1011 is connected to the sensor power source line VB, and is always kept at a constant reference potential. A source region of the buffer TFT 1011 is connected to a source region or a drain region of the selective TFT 1012.

A gate electrode of the selective TFT 1012 is connected to the gate signal line ($G_1$ to $G_x$). One of a source region and a drain region of the selective TFT 1012 is connected to the source region of the buffer TFT 1011 as described above, and the other is connected to the sensor output line ($SS_1$ to $SS_x$). The sensor output line ($SS_1$ to $SS_x$) is connected to the constant current power source (103_1 to 103_x), and is always supplied with a constant current.

In this embodiment, the polarity of the switching TFT 1004 is the same as that of the selective TFT 1012. That is, when the switching TFT 1004 is an N-channel type TFT, the selective TFT 1012 is also an N-channel type TFT. When the switching TFT 1004 is a P-channel type TFT, the selective TFT 1012 is also a P-channel type TFT.

Unlike the area sensor shown in FIG. 1, in the sensor portion of the area sensor of this embodiment, a gate electrode of the switching TFT 1004 and a gate electrode of the selective TFT 1012 are both connected to the gate signal lines ($G_1$ to $G_x$). Therefore, in the case of the area sensor of this embodiment, the length of a period during which the EL element 1006 of each pixel emits light is the same as that of a sampling period ($ST_1$ to $ST_N$). Because of the above-mentioned configuration, the number of wirings can be decreased in the area sensor of this embodiment, compared with the case shown in FIG. 1.

The area sensor of this embodiment is also capable of displaying an image on the sensor portion 1001.

The configuration of this embodiment can be arbitrarily combined with any of Embodiments 1 to 13.

Embodiment 15

Examples of electronic equipment using an area sensor of the present invention include a video camera, a digital still camera, a notebook computer, a portable information terminal (mobile computer, mobile phone, portable game machine, electronic book, etc.), and the like.

Figure 25A:
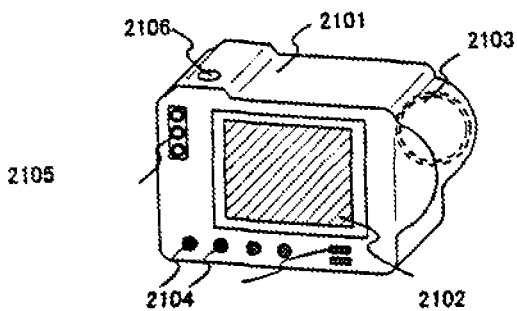
FIGS. 25A to 25C show exemplary electronic equipment to which the present invention is applicable.

FIG. 25A shows a video camera, which includes a body 2101, a display portion 2102, an image receiving portion 2103, an operation key 2104, an external connecting port 2105, a shutter 2106 and the like. The area sensor of the present invention can be applied to the display portion 2102.

Figure 25B:
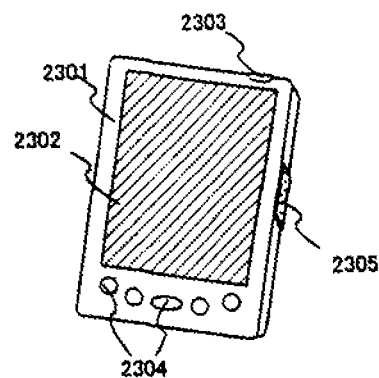

FIG. 25B shows a mobile computer, which includes a body 2301, a display portion 2302, a switch 2303, operation keys 2304, an infrared port 2305, and the like. The area sensor of the present invention can be applied to the display portion 2302.

Figure 25C:
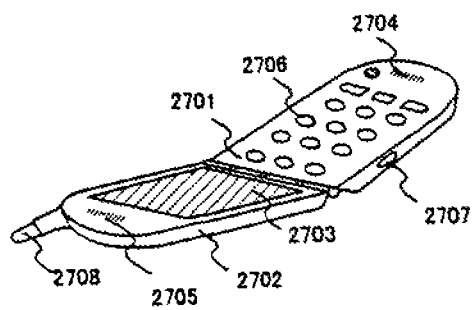

FIG. 25C shows a mobile phone, which includes a body 2701, a housing 2702, a display portion 2703, a voice input portion 2704, a voice output portion 2705, operation keys 2706, an external connecting portion 2707, an antenna 2708, and the like. The area sensor of the present invention can be applied to the display portion 2703.

As described above, the application range of the present invention is very large. Thus, the present invention can be used for electronic equipment in various fields.

This embodiment can be arbitrarily combined with the embodiment, and any of Embodiments 1 to 14.

According to the present invention, due to the above-mentioned configuration, light is radiated uniformly to a subject, so that no inconsistencies in lightness are caused in a read image. Furthermore, unlike a conventional example, it is not required to provide a backlight and a light scattering plate separately from a sensor substrate. Therefore, the mechanical strength of an area sensor is increased without requiring precise adjustment of the position of a backlight, a light scattering plate, a sensor substrate, and a subject. As a result, an area sensor can be made small, thin, and light-weight.

The area sensor of the present invention is also capable of displaying an image on a sensor portion, using EL elements. Therefore, even if an electronic display is not separately provided to the area sensor, an image read by the sensor portion can be displayed on the sensor portion, and the read image can be confirmed immediately.

Furthermore, in a photodiode used in the present invention, a photoelectric conversion layer is made of an amorphous silicon film, an N-type semiconductor layer is made of an N-type polycrystalline silicon film, and a P-type semiconductor layer is made of a P-type polycrystalline silicon film. The amorphous silicon film is thicker than the polycrystalline silicon film, and the ratio in thickness therebetween is preferably (1 to 10):1. Since the amorphous silicon film is thicker than the polycrystalline silicon film, the photoelectric conversion layer can receive more light. According to the present invention, the amorphous silicon film has a light absorptivity higher than that of the polycrystalline silicon film and the like, so that an amorphous silicon film is used for the photoelectric conversion layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

The invention claimed is:

1. A portable information terminal comprising:
   a plastic substrate;
   a first inorganic insulating film over the plastic substrate;
   a gate insulating film over the first inorganic insulating film;
   a second inorganic insulating film over the gate insulating film;
   an organic insulating film over the second inorganic insulating film;
   a first driver circuit and a second driver circuit over the plastic substrate; and
   a pixel portion over the plastic substrate, the pixel portion comprising a first pixel and a second pixel, each of the first pixel and the second pixel comprising a first to a fourth transistors and a capacitor, each of the transistors comprising a polycrystalline silicon film over the first inorganic insulating film, and a gate electrode overlapping the polycrystalline silicon film with the gate insulating film therebetween, the first pixel comprising:
an EL element comprising:
a first electrode;
a second electrode; and
an EL layer between the first electrode and the second electrode, and
a touch panel over the EL element,
wherein the second inorganic insulating film covers the gate electrodes of the transistors,
wherein the organic insulating film covers the second inorganic insulating film,
wherein the first electrode, the EL layer and the second electrode are over the organic insulating film, the first electrode being electrically connected to the one of the source and the drain of the first transistor through an opening in the organic insulating film,
wherein the pixel portion is between the first and the second driver circuits when seen in a plan view,
wherein a first line electrically connects a gate of the second transistor of the first pixel to the first driver circuit, and
wherein a second line electrically connects a gate of one of the first to the fourth transistors of the second pixel to the second driver circuit.

2. The portable information terminal to claim 1, further comprising a sensor in the second pixel,
wherein the one transistor of the first to the fourth transistors of the second pixel belongs to a sensor circuit comprising the sensor, and the second driver circuit is a sensor gate signal line driving circuit.

3. The portable information terminal according to claim 2, wherein the sensor is a photodiode.

4. The portable information terminal according to claim 1, further comprising:
an FPC fixed to the plastic substrate; and
a wiring formed on the flexible substrate, configured to connect an element comprised in the first pixel to the FPC.

5. The portable information terminal according to claim 1, further comprising an adhesive between the first transistor of the first pixel and the plastic substrate.

6. A portable information terminal comprising:
a plastic substrate;
a first inorganic insulating film over the plastic substrate;
a gate insulating film over the first inorganic insulating film;
a second inorganic insulating film over the gate insulating film;
an organic insulating film over the second inorganic insulating film;
a first driver circuit and a second driver circuit over the plastic substrate; and
a pixel portion over the plastic substrate, the pixel portion comprising a first pixel and a second pixel, each of the first pixel and the second pixel comprising a transistor and a capacitor, the transistor comprising a polycrystalline silicon film over the first inorganic insulating film, and a gate electrode overlapping the polycrystalline silicon film with the gate insulating film therebetween, the first pixel comprising:
an EL element comprising:
a first electrode;
a second electrode; and
an EL layer between the first electrode and the second electrode,
wherein the second inorganic insulating film covers the gate electrode of the transistor,
wherein the organic insulating film covers the second inorganic insulating film,
wherein the first electrode, the EL layer and the second electrode are over the organic insulating film, the first electrode being electrically connected to a first line,
wherein the pixel portion is between the first and the second driver circuits when seen in a plan view,
wherein a second line is directly connected to the gate electrode of the transistor, and
wherein the capacitor is directly connected to the first line and the transistor.

7. The portable information terminal to claim 6, wherein the first line is a power supply line.

8. The portable information terminal to claim 6, further comprising a sensor in the second pixel,
wherein the transistor of the second pixel belongs to a sensor circuit comprising the sensor, and the second driver circuit is a sensor gate signal line driving circuit.

9. The portable information terminal according to claim 8, wherein the sensor is a photodiode.

10. The portable information terminal according to claim 6, further comprising:
an FPC fixed to the plastic substrate; and
a wiring formed on the flexible substrate, configured to connect an element comprised in the first pixel to the FPC.

11. The portable information terminal according to claim 6, further comprising an adhesive between the transistor of the first pixel and the plastic substrate.

12. A portable information terminal comprising:
a plastic substrate;
a first inorganic insulating film over the plastic substrate;
a gate insulating film over the first inorganic insulating film;
a second inorganic insulating film over the gate insulating film;
an organic insulating film over the second inorganic insulating film;
a first driver circuit and a second driver circuit over the plastic substrate; and
a pixel portion over the plastic substrate, the pixel portion comprising a first pixel and a second pixel, each of the first pixel and the second pixel comprising a first to a third transistors, each of the transistors comprising a polycrystalline silicon film over the first inorganic insulating film, and a gate electrode overlapping the polycrystalline silicon film with the gate insulating film therebetween, the first pixel comprising:
an EL element comprising:
a first electrode;
a second electrode; and
an EL layer between the first electrode and the second electrode, and
wherein the second inorganic insulating film covers the gate electrodes of the transistors,
wherein the organic insulating film covers the second inorganic insulating film,
wherein the first electrode, the EL layer and the second electrode are over the organic insulating film,
wherein the pixel portion is between the first and the second driver circuits when seen in a plan view,
wherein a first line is directly connected to the gate electrode of the first transistor, wherein one of a source electrode and a drain electrode of the first transistor is directly connected to one of a source electrode and a drain electrode of the second transistor, wherein the other of the source electrode and the drain electrode of the first transistor is directly connected to a second line, wherein the gate electrode of the second transistor is directly connected to one of a source electrode and a drain electrode of the third transistor, wherein the gate electrode of the third transistor is directly connected to a third line, and wherein a fourth line is directly connected to the other of the source electrode and the drain electrode of the second transistor and the other of the source electrode and the drain electrode of the third transistor.

13. The portable information terminal to claim 12, wherein the first line is a gate signal line, and wherein the fourth line is a power supply line.

14. The portable information terminal to claim 12, further comprising a sensor in the second pixel, wherein one transistor of the first to the third transistors of the second pixel belongs to a sensor circuit comprising the sensor, and the second driver circuit is a sensor gate signal line driving circuit.

15. The portable information terminal according to claim 14, wherein the sensor is a photodiode.

16. The portable information terminal according to claim 12, further comprising:

an FPC fixed to the plastic substrate; and a wiring formed on the flexible substrate, configured to connect an element comprised in the first pixel to the FPC.

17. The portable information terminal according to claim 12, further comprising an adhesive between the first transistor of the first pixel and the plastic substrate.

* * * * *